(12) United States Patent
Kryliouk et al.

(10) Patent No.: US 9,431,477 B2
(45) Date of Patent: Aug. 30, 2016

(54) METHOD OF FORMING A GROUP III-NITRIDE CRYSTALLINE FILM ON A PATTERNED SUBSTRATE BY HYDRIDE VAPOR PHASE EPITAXY (HVPE)

(71) Applicants: Olga Kryliouk, Sunnyvale, CA (US);
Yuriy Melnik, Santa Clara, CA (US);
Hidehiro Kojiri, Sunnyvale, CA (US);
Tetsuya Ishikawa, Saratoga, CA (US)

(72) Inventors: Olga Kryliouk, Sunnyvale, CA (US);
Yuriy Melnik, Santa Clara, CA (US);
Hidehiro Kojiri, Sunnyvale, CA (US);
Tetsuya Ishikawa, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 13/959,469

(22) Filed: Aug. 5, 2013

(65) Prior Publication Data

US 2013/0320353 A1    Dec. 5, 2013

Related U.S. Application Data

(62) Division of application No. 12/837,390, filed on Jul. 15, 2010, now Pat. No. 8,507,304.

(60) Provisional application No. 61/226,440, filed on Jul. 17, 2009.

(51) Int. Cl.
*H01L 29/04*  (2006.01)
*H01L 21/02*  (2006.01)
(Continued)

(52) U.S. Cl.
CPC ......... *H01L 29/045* (2013.01); *H01L 21/0237* (2013.01); *H01L 21/0242* (2013.01); *H01L 21/0243* (2013.01); *H01L 21/0254* (2013.01); *H01L 21/0262* (2013.01);
(Continued)

(58) Field of Classification Search
USPC .................................................. 257/E29.105
See application file for complete search history.

(56) References Cited

U.S. PATENT DOCUMENTS 5,034,342 A    7/1991   Sidner et al.
5,208,821 A    5/1993   Berger et al.
(Continued)

FOREIGN PATENT DOCUMENTS

CN    1086608 A     5/1994
CN    1538498 A    10/2004
CN    101369530 A   2/2009

OTHER PUBLICATIONS

Y.K. Su et al., "InGaN/GaN Light Emitting Diodes with a p-Down Structure", IEEE Transactions on Electron Devices, vol. 49, No. 8, Aug. 2002, pp. 1361-1366.
(Continued)

*Primary Examiner* — Daniel Luke
(74) *Attorney, Agent, or Firm* — Blakely, Sokoloff, Taylor & Zafman LLP

(57) ABSTRACT

A method of depositing a high quality low defect single crystalline Group III-Nitride film. A patterned substrate having a plurality of features with inclined sidewalls separated by spaces is provided. A Group III-Nitride film is deposited by a hydride vapor phase epitaxy (HVPE) process over the patterned substrate. The HVPE deposition process forms a Group III-Nitride film having a first crystal orientation in the spaces between features and a second different crystal orientation on the inclined sidewalls. The first crystal orientation in the spaces subsequently overgrows the second crystal orientation on the sidewalls and in the process turns over and terminates treading dislocations formed in the first crystal orientation.

16 Claims, 23 Drawing Sheets

(51) Int. Cl.
  *H01L 33/00* (2010.01)
  *H01L 33/12* (2010.01)
  *H01L 33/16* (2010.01)
  *H01L 33/22* (2010.01)

(52) U.S. Cl.
  CPC .. *H01L 21/02433* (2013.01); *H01L 21/02439* (2013.01); *H01L 21/02458* (2013.01); *H01L 21/02488* (2013.01); *H01L 21/02639* (2013.01); *H01L 21/02647* (2013.01); *H01L 29/04* (2013.01); *H01L 33/007* (2013.01); *H01L 33/12* (2013.01); *H01L 33/16* (2013.01); *H01L 33/22* (2013.01)

(56) References Cited

U.S. PATENT DOCUMENTS

| | | |
|---|---|---|
| 5,488,497 A | 1/1996 | Takanashi et al. |
| 5,929,466 A | 7/1999 | Ohba et al. |
| 6,086,673 A | 7/2000 | Molnar |
| 6,146,457 A | 11/2000 | Solomon |
| 6,163,557 A | 12/2000 | Dunnrowicz et al. |
| 6,211,033 B1 | 4/2001 | Sandhu et al. |
| 6,218,280 B1 | 4/2001 | Kryliouk et al. |
| 6,348,096 B1 | 2/2002 | Sunakawa et al. |
| 6,350,666 B2 | 2/2002 | Kryliouk |
| 6,440,823 B1 | 8/2002 | Vaudo et al. |
| 6,486,499 B1 | 11/2002 | Krames et al. |
| 6,514,782 B1 | 2/2003 | Krames et al. |
| 6,521,914 B2 | 2/2003 | Krames et al. |
| 6,599,362 B2 | 7/2003 | Ashby et al. |
| 6,632,725 B2 | 10/2003 | Trassoudaine et al. |
| 6,656,272 B2 | 12/2003 | Tsvetkov et al. |
| 6,660,083 B2 | 12/2003 | Tsvetkov et al. |
| 6,699,760 B2 | 3/2004 | Hsu et al. |
| 6,733,591 B2 | 5/2004 | Anderson |
| 6,784,085 B2 | 8/2004 | Cuomo et al. |
| 6,864,158 B2 | 3/2005 | Ishida |
| 6,903,374 B2 | 6/2005 | Katayama |
| 6,936,851 B2 | 8/2005 | Wang |
| 6,943,095 B2 | 9/2005 | Vaudo et al. |
| 6,956,246 B1 | 10/2005 | Epler et al. |
| 6,986,693 B2 | 1/2006 | Chowdhury et al. |
| 7,001,813 B2 | 2/2006 | Manfra et al. |
| 7,084,563 B2 | 8/2006 | Chowdhury et al. |
| 7,087,930 B2 | 8/2006 | Senda et al. |
| 7,208,337 B2 | 4/2007 | Eisert et al. |
| 7,220,314 B2 | 5/2007 | Fukuyama et al. |
| 7,220,658 B2 | 5/2007 | Haskell et al. |
| 7,221,000 B2 | 5/2007 | Shen et al. |
| 7,259,402 B2 | 8/2007 | Edmond et al. |
| 7,297,625 B2 | 11/2007 | Nakahata et al. |
| 7,341,878 B2 | 3/2008 | Krames et al. |
| 7,348,600 B2 | 3/2008 | Narukawa et al. |
| 7,384,809 B2 | 6/2008 | Donofrio |
| 7,419,912 B2 | 9/2008 | Donofrio |
| 7,420,218 B2 | 9/2008 | Nagai |
| 7,456,035 B2 | 11/2008 | Eliashevich et al. |
| 7,468,578 B2 | 12/2008 | Chowdhury et al. |
| 7,473,315 B2 | 1/2009 | Nakahata et al. |
| 7,491,565 B2 | 2/2009 | Coman et al. |
| 7,501,299 B2 | 3/2009 | Wong et al. |
| 7,511,307 B2 | 3/2009 | Wuu et al. |
| 7,527,742 B2 | 5/2009 | Tysoe et al. |
| 2001/0042865 A1 | 11/2001 | Oshio et al. |
| 2001/0053612 A1 | 12/2001 | Juengling |
| 2004/0119078 A1 | 6/2004 | Konno et al. |
| 2006/0258027 A1 | 11/2006 | Ohmae et al. |
| 2008/0121903 A1 | 5/2008 | Hiramatsu et al. |
| 2008/0303042 A1 | 12/2008 | Minato et al. |
| 2009/0001394 A1* | 1/2009 | Cheng et al. ............... 257/97 |

OTHER PUBLICATIONS

F.K. Yam et al., "Innovative Advances in LED Technology", Microelectronics Journal 36 (2005), pp. 129-137.

John E. Northrup et al., "Indium Versus Hydrogen-Terminated GaN(0001) Surfaces: Surfactant Effect of Indium in a Chemical Vapor Deposition Environment", 2004 American Institute of Physics, Applied Physics Letters, vol. 84, No. 21, May 24, 2004, pp. 4322-4324.

C.K. Shu et al., "Isoelectronic In-doping Effect in GaN Films Grown by Metalorganic Chemical Vapor Deposition", 1998 American Institute of Physics, Applied Physics Letters, vol. 73, No. 6, Aug. 3, 1998, pp. 641-643.

F. Widmann et al., "Improved Quality GaN Grown by Molecular Beam Epitaxy Using In as a Surfactant", 1998 American Institute of Physics, Applied Physics Letters, vol. 73, No. 18, Nov. 2, 1998, pp. 2642-2644.

S. Keller et al., "Indium-Surfactant-Assisted Growth of High-Mobility AlN/GaN Multilayer Structures by Metalorganic Chemical Vapor Deposition", 2001 American Institute of Physics, Applied Physics Letters, vol. 79, No. 21, Nov. 19, 2001, pp. 3499-3451.

International Search Report and Written Opinion , International Application No. PCT/US2010/042351, International Filing Date: Jul. 16, 2010, 8 pages.

Search Report of Chinese Patent Application No. 201080041923.1, Filing Date: Jul. 16, 2010, 2 pages.

* cited by examiner

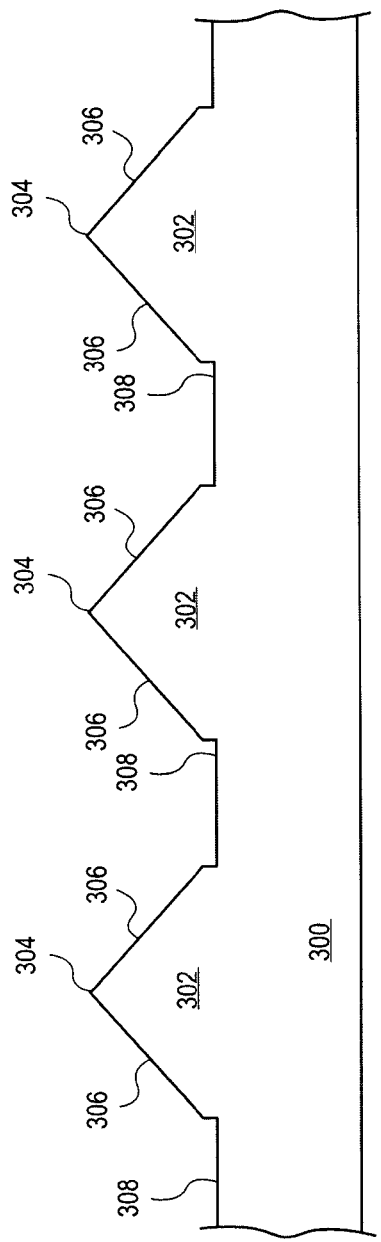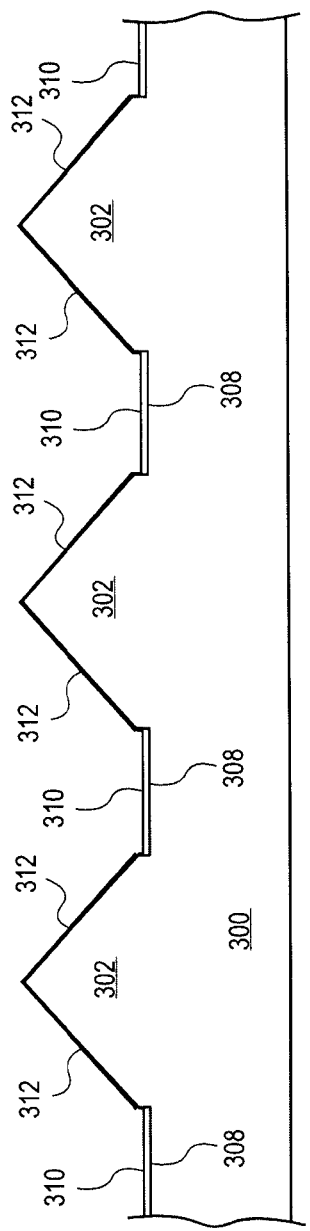
FIG. 3A
FIG. 3B

METHOD OF FORMING A GROUP III-NITRIDE CRYSTALLINE FILM ON A PATTERNED SUBSTRATE BY HYDRIDE VAPOR PHASE EPITAXY (HVPE)

This is a Divisional Application of Ser. No. 12/837,390 filed Jul. 15, 2010, which is presently pending which claims the benefit of and priority to Provisional Application Ser. No. 61/226,440 filed Jul. 17, 2009 which is hereby incorporated by reference.

BACKGROUND

1. Field

Embodiments of the present invention describe a method a manufacturing a high quality low dislocation density Group III-Nitride layer at a high growth rate by HVPE on a patterned substrate.

2. Discussion of Related Art

Group III-Nitride semiconductors are finding greater importance in the development and fabrication of the variety of semiconductor devices, such as light emitting diodes (LEDs), laser diodes (LDs) and electronic devices, such as high electron mobility transistors (HEMTs), hetero junction bipolar transistors (HBTs). An important requirement in forming these semiconductor devices is the fabrication of a suitably thick Group III-Nitride layer, such as a gallium nitride layer (GaN), with a smooth surface and a low dislocation density.

Presently Group III-Nitride layers are formed by metal organic chemical vapor deposition (MOCVD) techniques. The use of Group III-Nitrides in many applications has been limited by very high dislocation densities usually in the range of $10^9$-$10^{11}$ cm$^{-2}$. Those dislocations formed due to the use of lattice mismatched substrates, such as sapphire. The use of epitaxial lateral over growth (ELOG) has been used to reduce dislocation densities for gallium nitride (GaN) layers grown by MOCVD techniques. This technique, however, at best, provides dislocation densities in the range of $10^{8-9}$ cm$^{-2}$. Only over the narrow window regions lower dislocation densities ~$10^6$ cm$^{-2}$ could be utilized. It has also been proposed to use patterned sapphire substrates (PSS) and ELOG to improve the quality of the grown gallium nitride layer by MOCVD. This combination although an improvement, still has not provided highest crystalline quality films. This combination has provided reported values of full-width-half maximum (FWHM) of double crystal X-ray diffraction (DCXRD) in the (002) and the (102) crystalline planes of 210 arcsec and 240 arcsec, respectively. FWHM is a know technique for monitoring crystalline quality.

SUMMARY

A method of depositing a high quality low defect single crystalline Group III-Nitride film. A patterned substrate having a plurality of features with inclined sidewalls separated by spaces is provided. A Group III-Nitride film is deposited by a hydride vapor phase epitaxy (HVPE) process over the patterned substrate. The HVPE deposition process forms a Group III-Nitride film having a first crystal orientation in the spaces between features and a second different crystal orientation on the inclined sidewalls. The first crystal orientation in the spaces subsequently overgrows the second crystal orientation on the sidewalls and in the process turns over and terminates treading dislocations formed in the first crystal orientation.

BRIEF DESCRIPTION OF THE DRAWINGS

FIGS. 3A-3F illustrate a method of forming a single crystalline gallium nitride (GaN) film on a patterned sapphire substrate.

DETAILED DESCRIPTION

Embodiments of the present invention include a method of forming a high quality low defect density Group III-Nitride film on a patterned substrate. The present invention has been described with respect to specific details in order to provide a thorough understanding of the invention. One of ordinary skill in the art will appreciate that the invention can be practiced without these specific details. In other instances, will known semiconductor processes and equipment have not been described in specific detail in order to not unnecessarily obscure the present invention.

The present invention is a method of forming a high quality, low defect density Group III-Nitride crystalline film. According to embodiments of the present invention, a Group III-Nitride crystalline semiconductor film is formed by a hydride vapor phase epitaxial (HVPE) deposition process onto a patterned substrate. Embodiments of the present invention utilize substrate features of a desired shape, spacing, height and pitch to enable a high quality Group III-Nitride film to be grown thereon. The shape, size and pitch of the features along with the high growth rate and the ability to control lateral and vertical components of HVPE growth causes the termination of the threading dislocations (TDs) along the (0002) growth direction and thereby prevents them from propagating into the bulk Group III-Nitride film.

In a specific embodiment the features are provided with sloped sidewalls which when combined with specific HVPE deposition parameters causes the Group III-Nitride film to grow with a first crystal orientation and fast growth rate on flat surfaces between features and with a second crystal orientation and slow growth rate on the sloped sidewalls. As the fast growth rate crystal orientation grows from the spaces between features its lateral growth overlaps the slow growing crystal orientation on the sidewalls and begins the formation of an inclined growth facet. Threading dislocations which originate in the spaces between the features due to the large lattice mismatch between the substrate and the Group III-Nitride film propagate upward but are then turned sideways towards the sloped sidewalls when the reach the facet which results in their termination. Accordingly, it is the specific combination of feature size, shape and spacing along with the HVPE deposition parameters which enables this unique method of terminating threading dislocation and enabling a high quality low defect density single crystalline Group III-Nitride film to be formed.

Figure 1A:
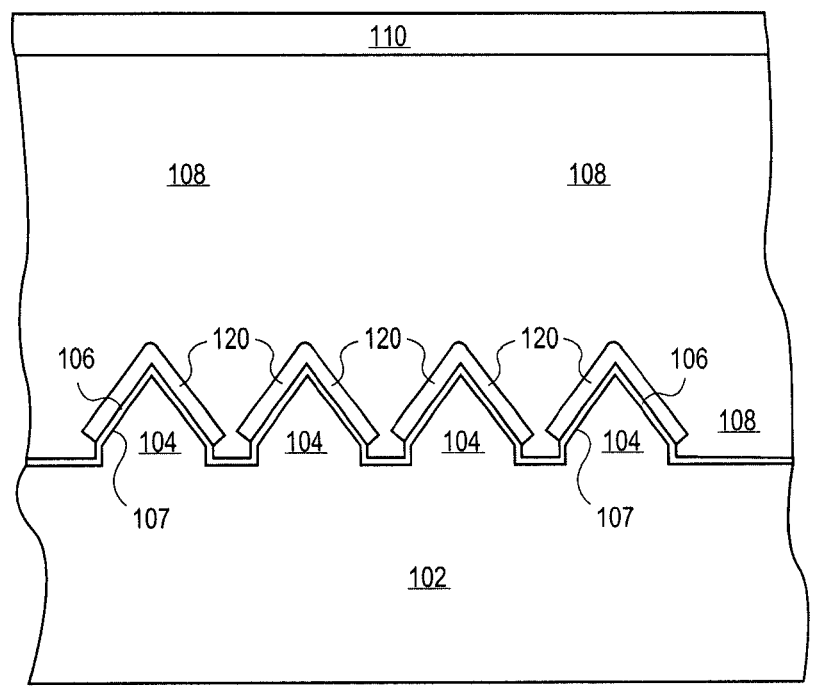
FIG. 1A is an illustration of a cross-sectional view of the formation of a Group III metal nitride epitaxial film formed by HVPE on a patterned substrate.

FIG. 1A illustrates a Group III-Nitride epitaxial or single crystalline film 108 formed on a patterned substrate 102 by hydride vapor phase epitaxial (HVPE) deposition in accordance with an embodiment of the present invention. Patterned substrate 102 includes a plurality of spaced apart features 104 which aid in the formation of a low dislocation density bulk film 108. A buffer layer 106 may be formed between the Group III-Nitride film 108 and patterned substrate 102. Features 104 have angled sidewalls as shown in FIG. 1A. The HVPE deposition process forms a Group III-Nitride film 108 having a first crystal orientation in the spaces between features 104 and a Group III-Nitride film 120 having second crystal orientation which is different than the first crystal orientation. In an embodiment the Group III-Nitride 120 is formed to a thickness between 0.1-1.0 microns. In an embodiment of the present invention the Group III-Nitride 120 on the sidewalls has a (11-00) crystal orientation while the Group III-Nitride in the spaces has a (0002) crystal orientation. In an embodiment of the present invention the Group III-Nitride film 120 on the sidewalls is a columnar nanocrystalline film having a plurality of aligned nanocrystals which extend substantially perpendicular from the inclined sidewalls. Alternatively the Group III-Nitride film 120 may be a Group III-Nitride film having an extremely high incorporation of threading dislocations (TDD). The Group III-Nitride film 108 formed in the spaces between features laterally overgrows the Group III-Nitride film 120 on sidewalls 107 as shown in FIG. 1A.

Patterned substrate 102 may be any suitable patterned single crystalline substrate upon which a Group III-Nitride epitaxial film 108 may be formed. Patterned substrate 102 may be formed from a substrate, such as but not limited to a sapphire ($Al2O_3$) substrate, a silicon (Si) substrate, a silicon carbide (SiC) substrate, a silicon on diamond (SOD) substrate, a quartz ($SiO_2$) substrate, a glass substrate, a zinc oxide (ZnO) substrate, a magnesium oxide (MgO) substrate, a lithium aluminum oxide ($LiAlO_2$) substrate and monocrystalline silicon substrate. Additionally the substrate may be a composite substrate such as a substrate which includes two or more different crystalline films. Such a substrate can be formed by for example transferring an epitaxial layer of one substrate to a second substrate having a second epitaxial structure. A composite substrate can also be formed by for example providing a mono-crystalline silicon substrate and then growing one or more buffer layers of different crystalline films having intermediate lattice constants to crystalline film that is ultimately desired, such as for example a sapphire ($Al2O_3$) crystalline film. The top film would be formed thick enough so that features could be formed therein. Any well know method, such as masking and etching may be utilized to form features 104 from a planar substrate to create a patterned substrate 102.

In a specific embodiment, patterned substrate 102 is a (0001) patterned sapphire substrate (PSS) with a 0.20 off cut angle from the c-plane. In an preferred embodiment, the substrate is a patterned (0001) sapphire substrate having an off-cut angle greater than 0.35° and generally between 0.35°-0.8° and ideally about 0.5° from the c-plane in order to enable a Group III-Nitride film with a smooth mirror like surface to be formed. Patterned sapphire substrates are ideal for use in the manufacturing of LEDs because they increase the light extraction efficiency which is extremely useful in the fabrication of a new generation of solid state lighting devices.

Group III-Nitride film 108 may be any Group III-Nitride epitaxial film that can be suitably deposited by hydride vapor phase epitaxy deposition. Group III-Nitride film 108 may be a binary, ternary, or quaternary compound semiconductor film formed from a Group III element or elements selected from gallium, indium and aluminum and nitrogen. That is, the Group III-Nitride crystalline film 108 can be any solid solution or alloy of one or more Group III element and nitrogen, such as but not limited to GaN, AlN, InN, AlGaN, InGaN, InAlN, and InGaAlN. In a specific embodiment, the Group III-Nitride film is a gallium nitride (GaN) film. The Group III-Nitride film can have a thickness between 2-500 microns and is typically formed between 2-15 microns. Thicknesses greater than 500 microns are possible because of the high growth rate of HVPE. In an embodiment of the present invention, the Group III-Nitride film has a thickness of at least 3.0 microns to sufficiently suppress threading dislocations.

Additionally, Group III-Nitride film 108 can be doped or undoped. The Group III-Nitride film 108 can be p-typed doped using any p type dopant such as but not limited Mg, Be, Ca, Sr, or any Group I or Group II element have one or two valence electrons. The Group III-Nitride film 108 can be p type doped to a conductivity level of between $1 \times 10^{16}$-$1 \times 10^{20}$ atoms/cm$^3$. The Group III-Nitride film 108 can be n type doped using any n type dopant such as but not limited to Si, Ge, Sn, Pb, or any suitable Group IV, Group V, or Group VI element. The Group III-Nitride film 108 can be n type doped to a conductivity level between $1 \times 10^{16}$-$1 \times 10^{20}$ atoms/cm$^3$.

Buffer layer 106 can be any suitable Group III-Nitride crystalline layer. Buffer layer 106 can be a binary, ternary or quaternary film comprising a solid solution of one or more Group III elements and nitrogen. Buffer layer 106 can be any crystalline film which is latticed matched (i.e., have the same cubic structure) with the Group III-Nitride crystalline film that is to be formed. Buffer layer 106 will generally have a lattice constant between the lattice constant of patterned substrate 102 and Group III-Nitride film 108 to better match substrate 102 and to provide thermal stability. Buffer layer 106 is ideally formed by HVPE and in-situ (i.e. in the same chamber and without breaking vacuum) with Group III-Nitride film 108. Buffer layer 106 is not limited to native nitride materials, but other layers lattice-matched to the GaN layer can be used: such as but not limited to ZnO, $LiAlO_2$, and SiC. Alternatively, buffer layer 106 may be formed in a separate chamber and/or by a different process, such as MOCVD, PVD or plasma treatment. In an embodiment of the present invention, buffer layer 106 is formed to a thickness between 10-100 nanometers, but thickness could vary and in some cases it could be up to 0.5-1.0 µm.

An additional device layer or layers 110 may be formed on top of Group III-Nitride epitaxial film 108 which may be necessary for the fabrication of the desired semiconductor device, such as light emitting diodes (LEDs), laser diodes (LDs) or electronic devices, such as high electron mobility transistors (HEMTs), hetero junction bipolar transistors (HBTs) and quantum well devices. For example, in the fabrication of light emitting diodes (LEDs) additional device layers 110 may include LED device layers 112 formed on the Group III-Nitride film 108.

Figure 1B:
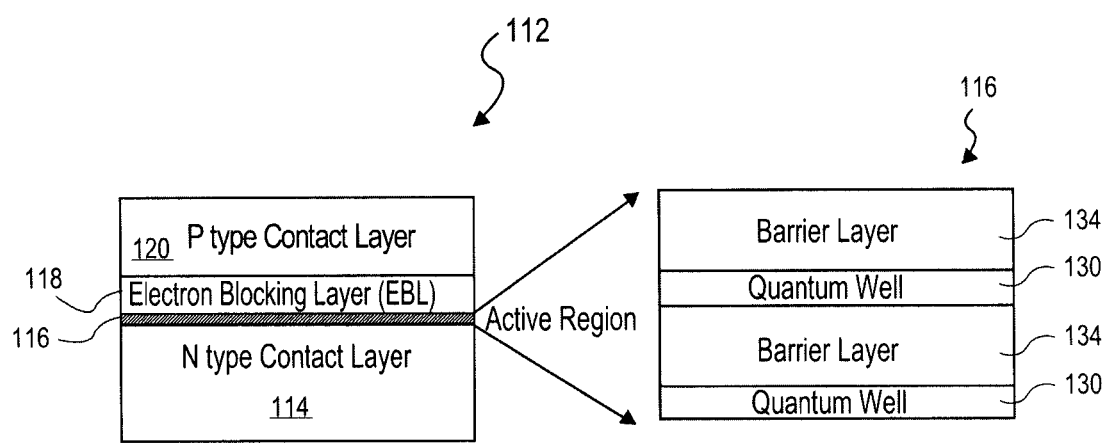
FIG. 1B is an illustration of example LED device layers that may be formed on a Group III-Nitride film.

FIG. 1B illustrates an example of LED device layers 112 which may include an n type contact layer 114, an active region 116, an electron blocking layer 118, and a p type contact layer 120. The active region 116 may comprise a single or multiple quantum wells 130 (such as InGaN) formed on a single or multiple barrier layers 134 (such as GaN). Forming LED device layers 112 on a smooth, low defect density Group III-Nitride film 108 results in enhanced internal quantum efficiency (IQE) and light extraction of the LED device.

Figure 2A:
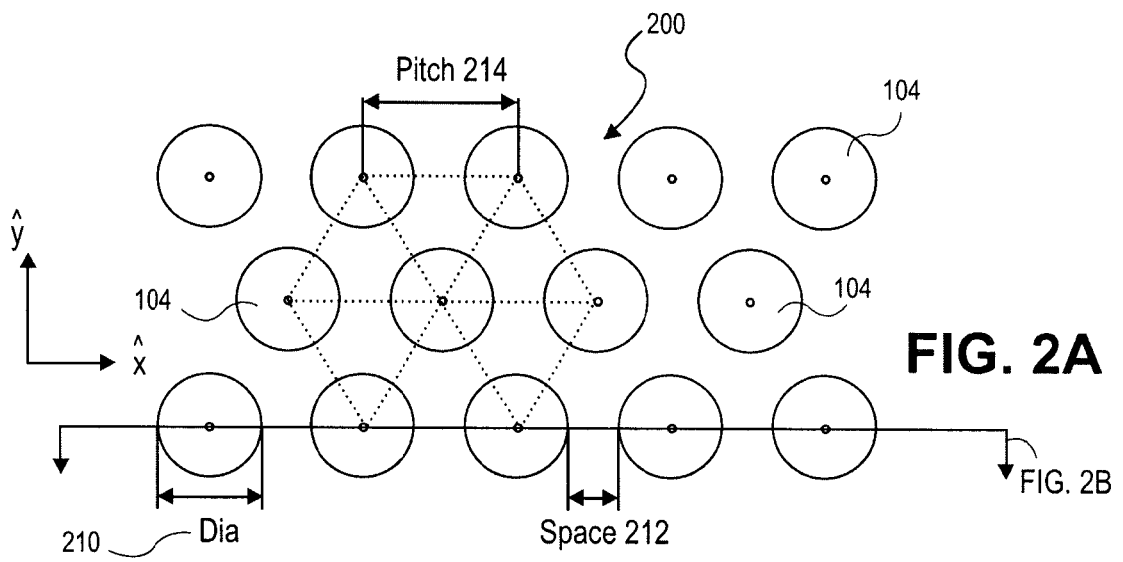
FIG. 2A is an illustration of an overhead view of a pattern of features formed on a substrate in accordance with an embodiment of the present invention.
Figure 2B:
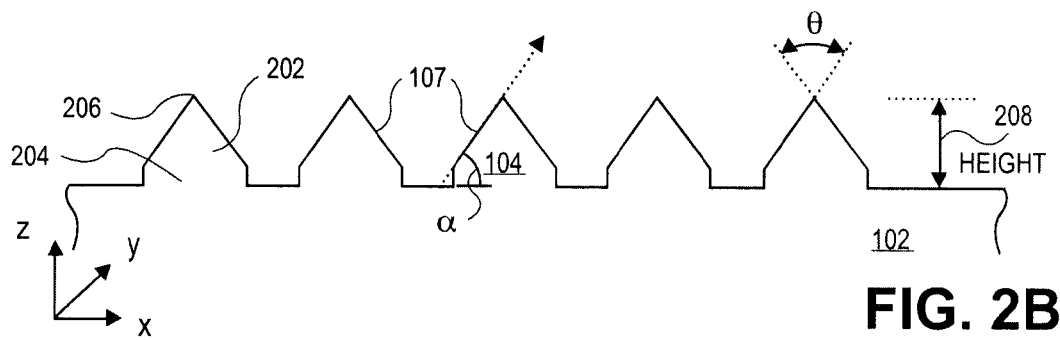
FIG. 2B is a cross-sectional view of the patterned illustrated in FIG. 2A.
Figure 2C:
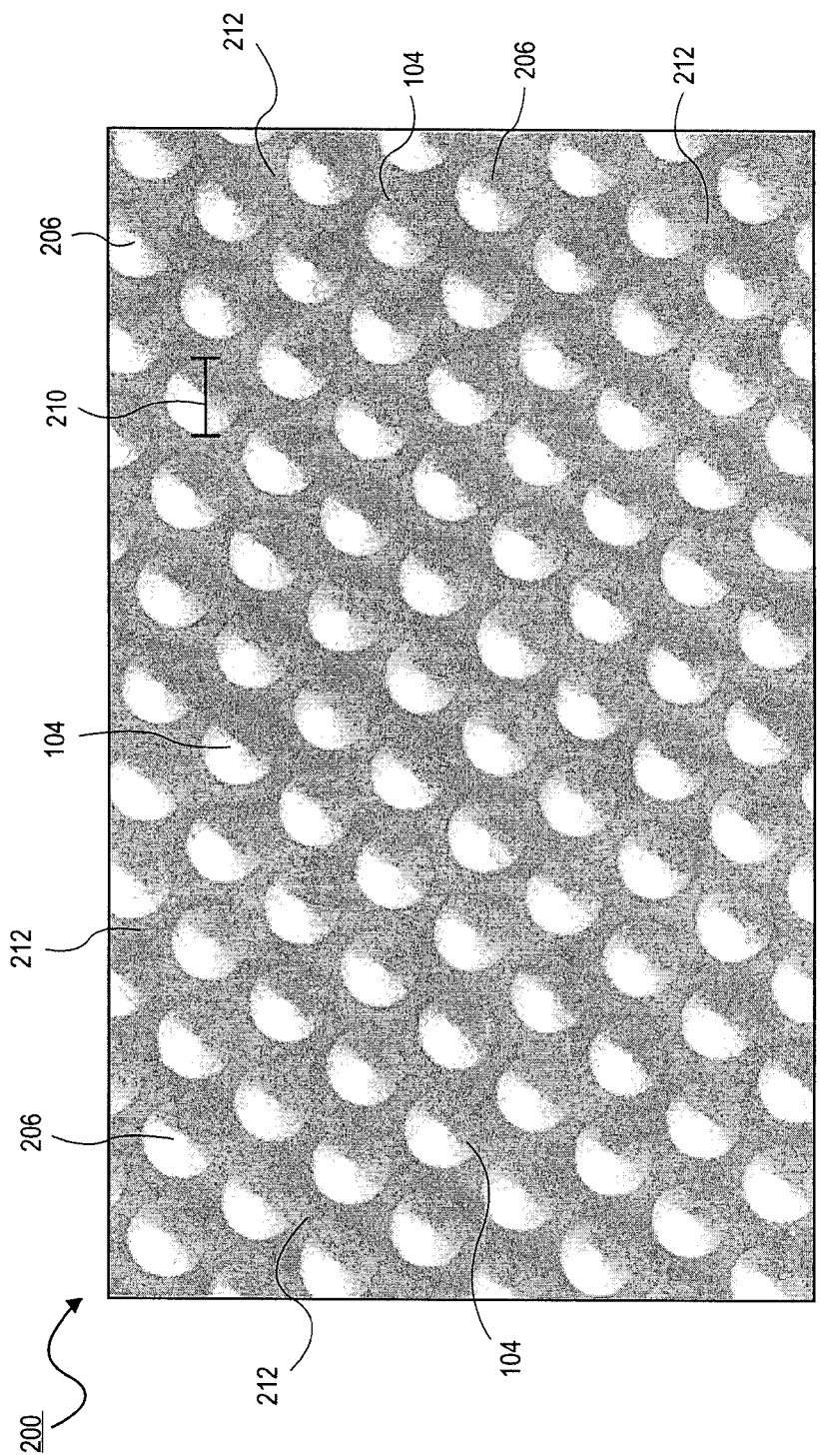
FIG. 2C is a SEM of an overhead view of a pattern of features formed on a substrate in accordance with an embodiment of the present invention.

Patterned substrate 102 may contain any pattern of features 104. Patterned substrate 102 may contain a pattern of features 104 which in combination with an HVPE deposition process results in the formation of a bulk single crystalline Group III-Nitride film of varying smoothness and varying defect density. In one embodiment, patterned substrate 102 may contain any pattern of features 104 which in combination with an HVPE deposition process results in the formation of a smooth, bulk single crystalline Group III-Nitride film. FIGS. 2A-2C illustrate an example of a feature pattern 200 which results in a smooth, low defect density Group III-Nitride expitaxial crystalline film formed by HVPE. FIG. 2A is an overhead view of feature pattern 200 while FIG. 2B is a cross-sectional view. FIG. 2C is a Scanning Electron Microscope (SEM) image of an overhead view of a feature pattern which can be used in the formation of a high quality defect free Group III-Nitride film in accordance with embodiments of the present invention.

In an embodiment of the present invention, patterned substrate 102 contains a plurality of features 104 having a cone shape. In a particular embodiment, feature 104 has a conical portion 202 and a base portion 204. In an embodiment of the present invention, feature 104 has a tip portion 206 with a sharp point to prevent over growth. In an embodiment, the tip 206 has an angle (Θ) of less than 145° and ideally less than 110°. Additionally, in an embodiment, feature 104 has a base portion 204 which forms a substantially 90° angle with respect to the x-y plane of substrate 102. In an embodiment base portion 204 represents only a small portion, such as less than 5%, of the total height of feature 104. In some embodiments there is no base portion and the feature consists only of the conical portion 202. In an embodiment of the present invention, the features 104 have sloped sidewalls or surfaces 107 which extend at an angle alpha of between 30°-60° from the planar surface (x-y plane) of the substrate as shown in FIG. 2B.

In an embodiment of the present invention, feature 104 has a height 208 between 0.7 and 1.5 microns and ideally about 1.0 microns. In an embodiment of the present invention, feature 104 has a diameter 210 between 1.0 and 4.0 microns and ideally about 2.0-3.0 microns. In an embodiment of the present invention, feature 104 has a diameter to height ratio of approximately less than 3:1 and ideally less than 2:1. In an embodiment, features 104 are spaced apart by a spacing 212 of between 0.5 to 1.5 microns and ideally about 1.0 microns. Additionally, as shown in FIG. 2A, each feature 104 is ideally equally spaced apart from each adjacent feature. In an embodiment, features 104 have a pitch 214 of between 1.5-5.0 microns and ideally about 3.0 microns wherein the pitch is defined as the distance between adjacent tips 206. In an embodiment of the present invention, pattern 200 has a feature spacing 212 to height 208 ratio of about 1:1.

The present invention is described with respect to specific feature structures and patterns which can be used to form a high quality low defect Group III-Nitride film in accordance with embodiments to the present invention, other feature structures and patterns may be used without departing from the scope of the present invention as long as the features when combined with a suitable HVPE deposition process enables the formation of a Group III-Nitride film having a first crystal orientation in spaces between features and a second different crystal orientation on inclined sidewalls of features. For example, although features 104 ideally have a sharp point in order to prevent threading dislocations from originating therefrom in the (0002) growth direction, the features may include a rounded top. Additionally, although features 104 ideally have a small base portion 204, such as less than 5% of the total feature height, features 104 may be formed with a large base portion 204 such as greater than 50% of the total feature height. In such a case, a Group III-Nitride film having a third crystal orientation may be grown on the vertical sidewalls of the base portion. Still further, although features 104 ideally are cone-shaped features having a conical portion with rounded sidewalls 107, features 104 may have faceted sidewalls, such as a pyramid shape, and have a plurality of angled sidewalls formed of discrete planes.

Figure 12A:
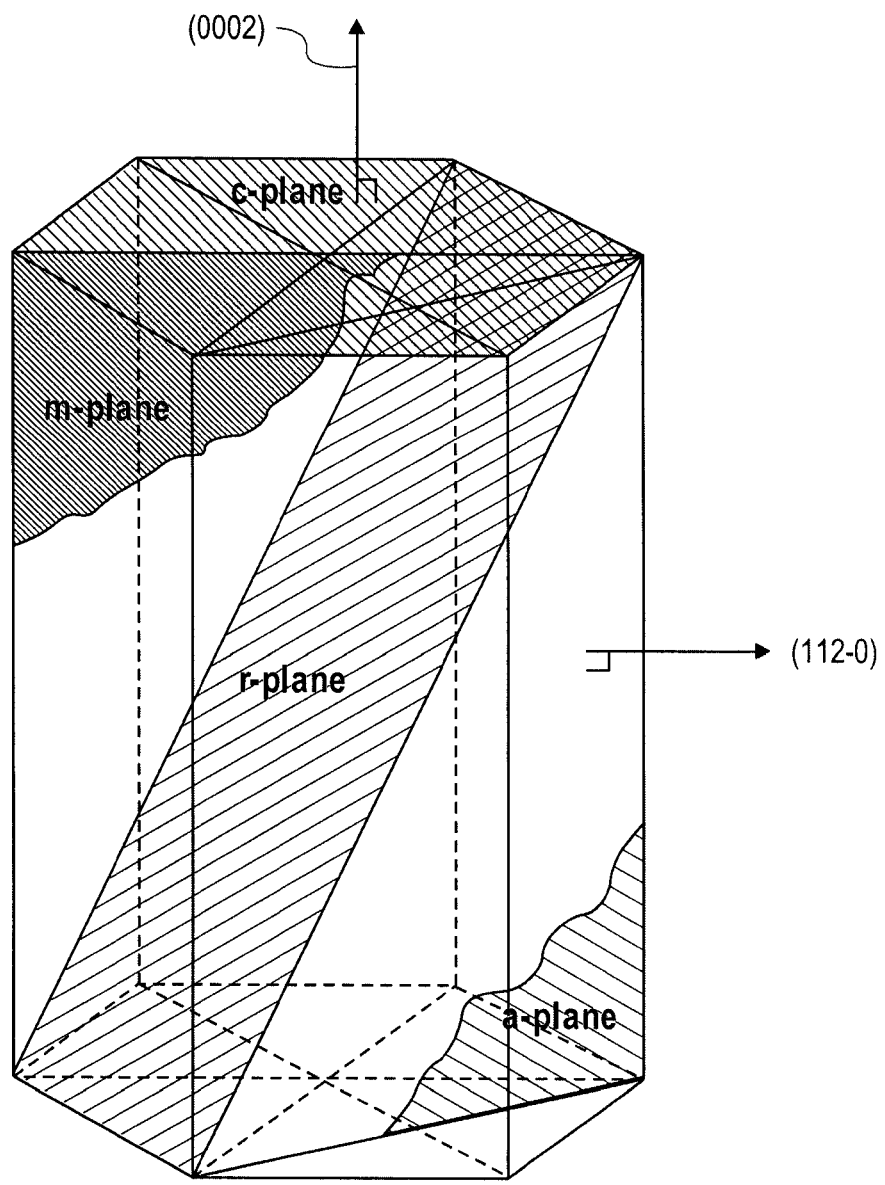
FIG. 12A is an illustration of the crystal orientation of a gallium nitride crystal.
Figure 12B:
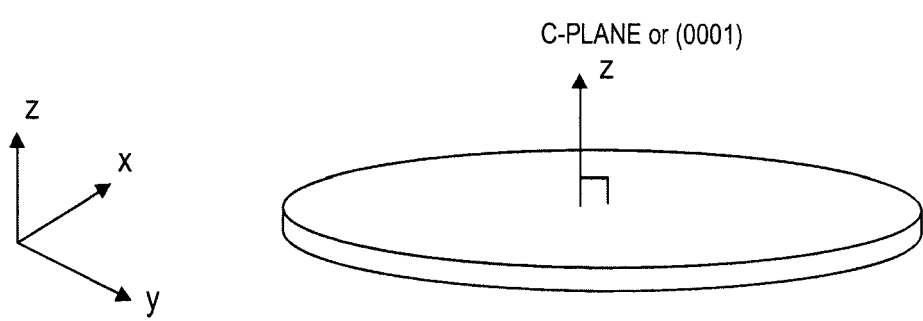
FIG. 12B is an illustration of a planar sapphire substrate which may be used to from a patterned sapphire substrate in accordance with embodiments of the present invention.

FIGS. 3A-3F illustrates a method of forming a high quality low defect density single crystalline Group III-Nitride film in accordance with embodiments of the present invention. Although the method of the present invention is described with respect to a preferred method of forming a single crystalline gallium nitride (GaN), the teaching described herein are equally applicable to other Group III-Nitrides including but not limited to indium nitride (InN), and aluminum nitride (AlN), as well as ternary Group III-Nitrides such as AlGaN, InGaN, and InAlN and quaternary Group III-Nitrides such as InGaAlN. The gallium nitride (GaN) single crystalline film is formed on a patterned sapphire substrate (PSS) 300. In an embodiment of the present invention, the sapphire substrate is a (0001) sapphire substrate having a plurality of features 302 formed therein. Patterned sapphire substrate 300 can be formed by sawing a sapphire ($Al_2O_3$) crystal or ingot along the c-plane with a 0.1° to a 1.50° off cut angle from the (0001) or c-plane. In an embodiment of the present invention, the sapphire crystal is cut at an offset angle of greater than 0.35° and generally between 0.35° to 0.65° from the c-plane and ideally at an off cut angle of about 0.5° from the c-plane. This produces a substrate or wafer having a planar surface (x-y plane) as shown in FIG. 12B with a (0001) crystal orientation extending in the z-direction but slightly offset by the cut angle. A large off-cut angle of greater than 0.35° and generally between 0.35°-0.65° from the c-plane enables the formation of a bulk single crystalline Group III-Nitride film with a very smooth surface and specifically a single crystalline gallium nitride film (GaN) with a smooth surface.

When a GaN film is grown on a c-plane of a sapphire crystal, the GaN film will follow the sapphire substrate's crystal orientation and create a polar gallium nitride (GaN) film having a (0002) crystal orientation in the z-direction.

In an embodiment of the present invention, when a non-polar gallium nitride (GaN) single crystalline film is desired, a substrate may be cut from a sapphire crystal along the m-plane. A gallium nitride film formed on the m-plane of a sapphire substrate will mimic the substrates crystal orientation and form a non-polar single crystalline gallium nitride film. In another embodiment of the present invention, when a semi-polar gallium nitride (GaN) single crystalline film is desired, a substrate may cut from a sapphire crystal along the a-plane or r-plane. A gallium nitride film formed on the a-plane or r-plane of the sapphire substrate will be a semi-polar single crystal film.

Features 302 can then be formed into the planar sapphire substrate to create a patterned substrate with any suitable feature pattern, such as patterns shown and described with respect to FIGS. 2A-2C. Features 302 can be formed by any suitable technique, such as by masking portions of the planar sapphire substrate and then etching the sapphire substrate with, for example, a wet etchant or a plasma etchant. It is to be noted that since features 302 are formed by etching the planar sapphire ($Al_2O_3$) substrate to form features 302, features 302 are sapphire ($Al_2O_3$) features.

The feature pattern characteristics such as size, shape and spacing of features 302 are chosen such that when used in combination with a particular HVPE deposition process a low defect, smooth, high quality bulk single crystalline gallium nitride film is formed. In an embodiment of the present, features 302 are equally spaced cone shaped features having a sharp point 304 created by angled sidewalls 306 such as described and illustrated with respect to FIG. 2A-2C. In an embodiment of the present invention the sidewalls are inclined at an angle of between 30°-60° from the substrate surface. In an embodiment of the present invention, features 302 have height between 0.7 to 1.5 microns and ideally about 1 micron. In an embodiment of the present invention, features 302 have a diameter between 1.0 microns and 4.0 microns and ideally between about 2.0-3.0 microns. In an embodiment of the present invention, the features 302 are equally spaced apart from one another by a distance of about 0.5 to 1.5 microns and ideally about 1.0 micron. In an embodiment of the present invention, the features 302 have a diameter/space ratio between 2:1 and 3:1 inclusive. In a specific embodiment of the present invention, the patterned substrate 300 is a (0001) substrate with a off cut angle of about 0.5° from the c-plane with equally spaced cone shaped features having a height of about 1 micron, a diameter of about 2 microns and a spacing of about 1 micron.

Figure 13:
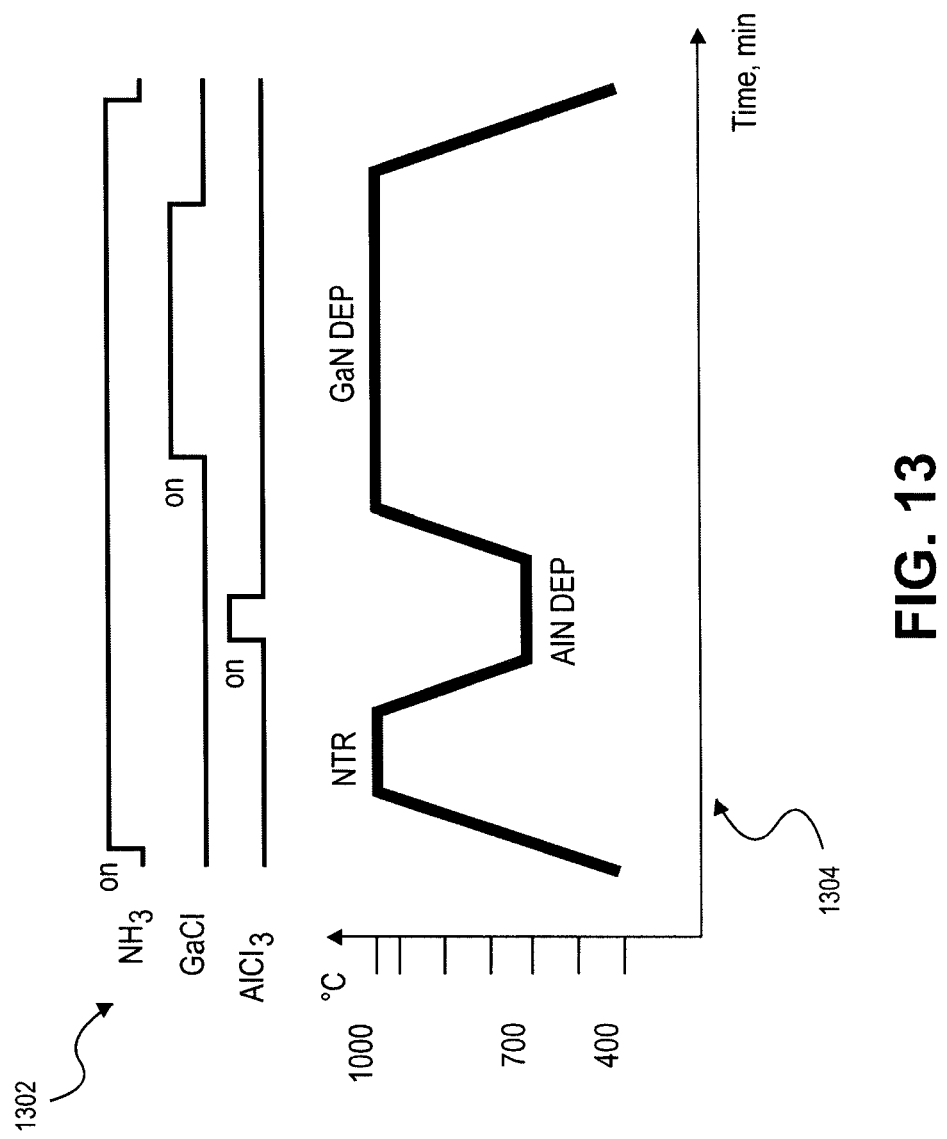
FIG. 13 illustrate gas flow timing diagrams and substrate temperature profiles which can be used to form a single crystalline gallium nitride film in accordance with embodiments of the present invention.

In an embodiment of the present invention, a single crystalline gallium nitride (GaN) film is formed by an insitu process wherein a nitridation process, an aluminum nitride (AlN) buffer layer and a bulk gallium nitride layer are all formed in a single chamber of a hydride vapor phase epitaxial reactor without breaking vacuum. FIG. 13 is an illustration of a source gas timing diagram 1302 and a temperature timing diagram 1304 which illustrate when the nitrogen source gas (e.g., $NH_3$), the gallium source gas (e.g. GaCl and/or $GaCl_3$) and the aluminum source gas (e.g., $AlCl_3$) are feed into the chamber and the temperature of the substrate during the nitridation step, the AlN buffer layer formation step, and the gallium nitride (GaN) formation step. A suitable HVPE reactor and its method of use is illustrated and described with respect to FIGS. 4-11.

In an embodiment of the present invention, the formation of the gallium nitride film begins with an optional nitridation process where the patterned sapphire substrate (PSS) is exposed to a nitridation process. The nitridation process forms a few monolayers (not shown) of aluminum nitride (AlN) and/or aluminum oxynitride (AlON) over the surface of the substrate including features 302. The nitridation process can be carried out by placing substrate 300 into a chamber of a hydride vapor phase epitaxial (HVPE) reactor, which will subsequently be used to form the gallium nitride single crystalline film. In an embodiment of the present invention, the substrate is placed in the HVPE reactor and heated to a temperature between about 980° C.-1100° C. and ideally to about 1040° C. for about 5-10 minutes at a pressure between 100-500 torr and ideally 450 torr while flowing between about 3-6 SLM of NH3 and 3 SLM of N2 into the chamber.

Next, a thin buffer layer is formed over patterned substrate 300. In embodiment of the present invention a low temperature aluminum nitride (AlN) single crystalline buffer layer is formed. The AlN/AlON buffer layer can be formed by reducing the temperature of the substrate to a temperature between 640° C.-680° C. and ideally to a temperature of 660° C. while maintaining the chamber pressure between 100-500 torr and ideally at 450 torr. Ammonia ($NH_3$) is fed into the chamber at a flow rate of 3-6 SLM to provide a nitrogen source. In an embodiment of the present invention the $NH_3$ source gas is feed into the chamber with an $N_2$ carrier having a flow rate of 3-6 SLM. Additionally, aluminum trichloride ($AlCl_3$) is fed into the chamber as a source of aluminum. In an embodiment of the present invention, the $AlCl_3$ source gas is formed by flowing 10-100 SCCMs of $Cl_2$ gas over a boat containing solid aluminum (Al) heated to a temperature of about 550° C. In an embodiment of the present invention the $AlCl_3$ source gas is feed into the chamber with an $N_2$ carrier gas having a flow rate of 3-6 SLM. The N2 carrier gas is feed into the $AlCl_3$ gas line "post boat" or downstream of the aluminum containing boat. The $AlCl_3$ gas is fed into the chamber for a time between 30 to 150 seconds. The HVPE deposition process forms a single crystalline aluminum nitride (AlN) layer 310 having a thickness between about 10-100 nanometers on the flat surfaces 308 between features 302 and a very thin layer 312 of aluminum oxynitride (AlON) a thickness between 10-100 angstroms on the sidewalls 306 of cone shaped features 302. Accordingly, in an embodiment of the present invention, the buffer layer can be considered an AlN/AlON buffer layer 310/312. It is thought that because the growth rate of the AlN crystal orientation in the spaces 318 between features is much greater than the growth rate of the AlN crystal orientation on the sidewalls 312 of the cones essentially no or very little aluminum nitride (AlN) has an opportunity to form on the sidewalls 306 during the short deposition time.

Figure 3C:
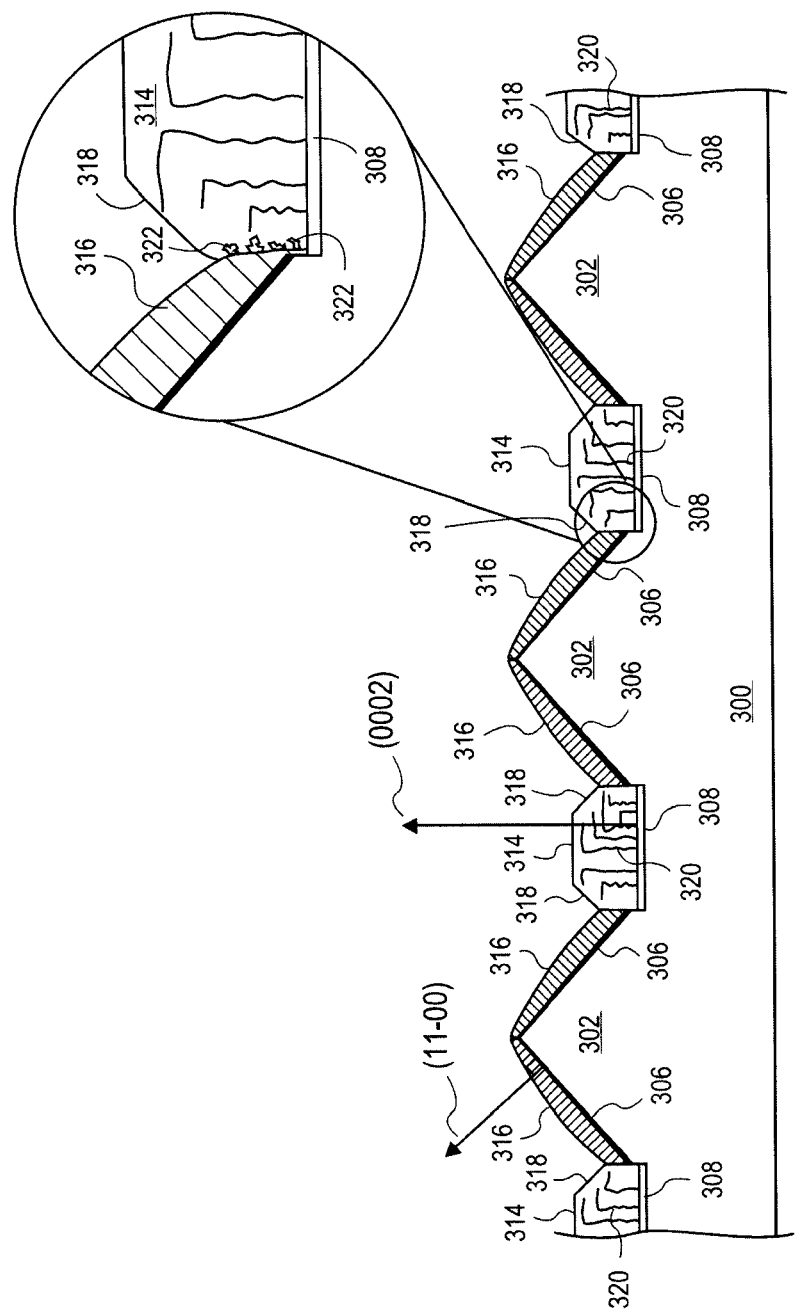

Next, as illustrated in FIG. 3C, a gallium nitride (GaN) single crystalline film is formed over the AlN/AlON buffer layer 310/312. The gallium nitride single crystalline film is formed by HVPE and is ideally formed insitu with the low temperature AlN/AlON buffer layer (i.e. in the same chamber without breaking vacuum). In an embodiment of the present invention, the gallium nitride single crystalline film is epitaxially deposited insitu with the AlN/AlON layer by increasing the deposition temperature to a temperature between 1050°-1120° C. and generating a chamber pressure between 100-500 torr and ideally between 250-450 torr. Ammonia ($NH_3$) is fed into the chamber at a flow rate between 15-25 SLM to provide a source of nitrogen. In an embodiment of the present invention the $NH_3$ source gas is feed into the chamber with an $N_2$ carrier gas having a flow rate between 3-6 SLM. Gallium chloride (GaCl) is fed into the reaction chamber to provide a source of gallium. In an embodiment of the present invention, the $GaCl/GaCl_3$ source gas is formed by flowing chlorine gas ($Cl_2$) at a rate of 10-250 SCCM over a boat containing liquid gallium heated to a temperature of about 800° C. Although both GaCl and $GaCl_3$ chlorides are generated at these conditions, at temperatures greater than 550° C., GaCl is predominant. In an embodiment, the GaCl source gas is fed into the chamber with an $N_2$ carrier gas at a flow rate of 5-20 SLM. The $N_2$ carrier gas is fed into the GaCl gas line "post boat" or downstream of the gallium containing boat.

FIG. 3C illustrates the formation of a gallium nitride film after about one minute of deposition time. As shown in FIG. 3C, a gallium nitride (GaN) film 314 forms on the aluminum nitride film formed in the spaces or valleys 308 between features and a gallium nitride film 314 forms on the aluminum AlON film formed on the sidewalls 306 of features 302. The single crystalline gallium nitride film 314 grown in spaces 308 is matched to the crystal orientation of the sapphire substrate and accordingly has a (0002) crystal orientation and grows vertically in the (0002) crystal direction. FIG. 12A is an illustration of a gallium nitride crystal showing its various planes as well as the vertical (0002) and lateral (112-0) growth directions for a (0002) orientated crystal. Gallium nitride film 316 grown on the sidewalls 306 of features 302 has a different crystal orientation than the (0002) crystal orientation GaN 314 grown in the spaces 308. In an embodiment of the present invention the GaN film 316 formed on the inclined or sloped sidewalls 306 has a (11-00) crystal orientation growing substantially perpendicular to inclined sidewalls 306 as shown in FIG. 3C. Because the (0002) growth direction has the highest growth rate for gallium nitride films formed by HVPE, the gallium nitride film 314 formed in the spaces grows at a much higher rate (5-10 times higher than the lateral growth rate) resulting in a gallium nitride film 314 in the spaces 308 which is much thicker than the (11-00) gallium nitride film 316 formed on the sidewalls of the cone. After approximately one minute of deposition time, approximately 770 nanometers of (0002) crystal orientated single crystal gallium nitride (GaN) is formed in the spaces 308 between the cones while only about 160 nanometers of (11-00) crystal orientated gallium nitride is formed on the sidewalls 306 of cones 302.

Additionally, it is to be noted that since the nucleation and growth chemistries are different on the flat areas 308 between the features and the sidewalls 306 of the cones, the gallium nitride film 314 on the flat areas 308 forms as a single crystalline film while the gallium nitride film 316 on the sidewalls 306 forms as a nanocrystalline or microcrystalline film or a gallium nitride film with extremely high treading threading dislocations (TDD). In an embodiment micro/nanocrystalline gallium nitride (GaN) film 316 has a plurality of aligned nanocrystals which are situated substantially perpendicular to the sidewalls 306 of the cone shaped features 302 thereby forming a columnar nanocrystalline or microcrystalline film 316. The columnar nanocrystals are approximately 20.degree. titled from the (0002) growth direction and have a (11-00) crystal orientation as illustrated in FIG. 3C. The columnar nanocrystalline gallium nitride film 316 tends to grow slightly thinner towards the base of the cone than at the center of the sidewall. Additionally, although the columnar nanocrystalline film 316 is shown as being grown symmetrically on both sides of a cone, it can, at times, grow asymmetrically with one side growing faster than other side. It is thought that the higher growth rate which leads to a thicker sidewall growth is due to a better epitaxial relationship between the grown film and the underlying sapphire substrate. Additionally, because features 302 have a sufficiently sharp point 304, such as an angle less than 145°, and ideally less than 110.degree., and not a rounded or flat top, only columnar nanocrystalline gallium nitride 316 is grown thereon, and no threading dislocations in the (0002) growth direction originate therefrom.

Since the single crystalline GaN film 314 in the spaces 308 grows much faster rate than the columnar nanocrystalline GaN film 316 on the sidewalls, the lateral growth of the single crystalline GaN film 314 begins to overgrow the columnar nanocrystalline film 316 on the sidewalls 306 and begins the formation of inclined growth facets 318. It is to be noted that the lateral growth component of a (0002) orientated GaN film 314 is in the (112-0) direction as illustrated in FIG. 12A. Additionally, as illustrated in FIG. 3C, due to the large lattice mismatch between the sapphire substrate and the single crystalline GaN film 314 formed in the spaces 308, a large number of threading dislocations 320 are formed in the gallium nitride film 314 in the (0002) growth direction. As the thinner gallium nitride film 316 formed on the sidewalls is overgrown by the valley gallium nitride film 314 and create facet 318, the threading dislocations rapidly turn over (i.e., make a 90° turn) towards the cone as illustrated in FIG. 3C. It is to be noted that, both screw and edge component type dislocations turn over towards the cone. Additionally, a-type lateral dislocations nucleated from the cones annihilate with threading dislocations nucleated from spaces between features.

Additionally, as deposition occurs, small voids 322 develop at the interface between the columnar nanocrystalline gallium germanium film 316 and the single crystalline gallium nitride layer 314 as illustrated in FIG. 3C. The small voids formed at the interface can help eliminate stress in the subsequently formed bulk crack-free single crystalline gallium nitride (GaN) film.

Figure 3D:
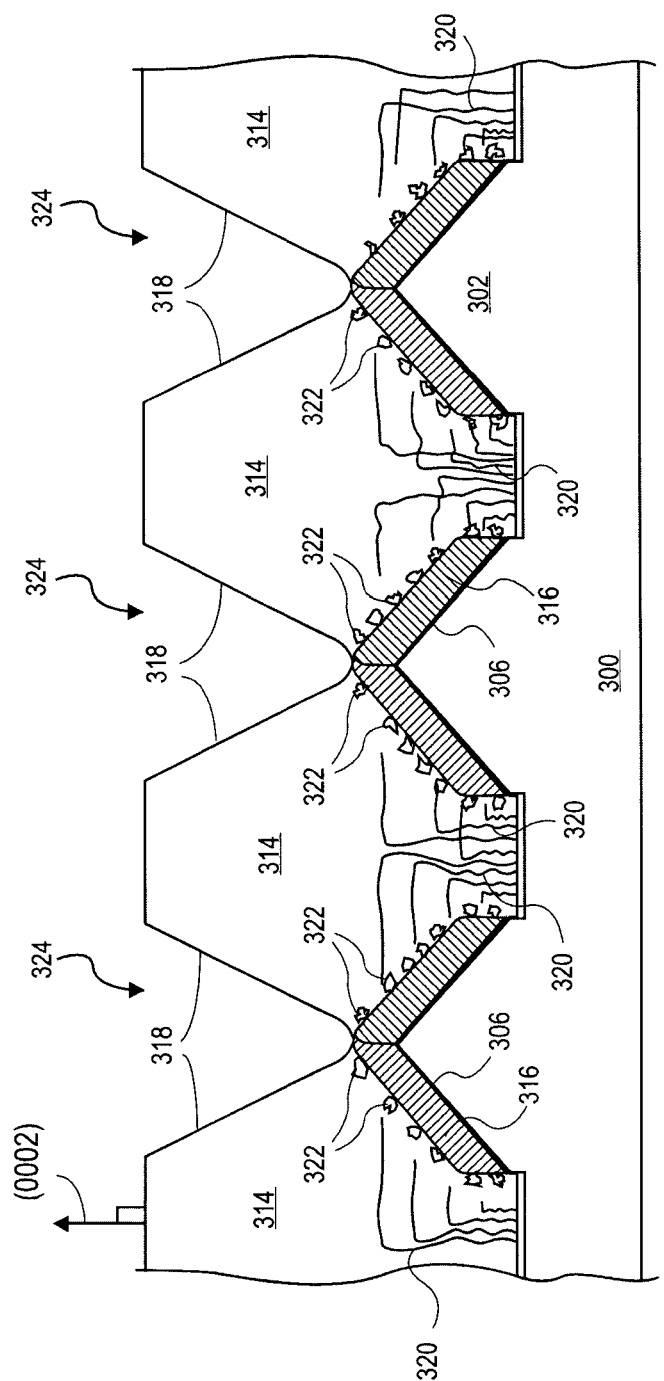

FIG. 3D is an illustration of the formation of the gallium nitride film after approximately five minutes of deposition time. At this time the gallium nitride film 314 has almost completely overgrown the columnar nanocrystalline film 316 but the layer has not yet completely coalesced over the cone tips 306. Large pits 324 are centered directly over the cone tips 304. Because the vertical (0002) growth rate of the single crystalline gallium nitride film 314 in the valleys is much greater than the lateral (112-0) growth rate of the single crystalline nitride film 314, the overgrowth of the cones is slow and large facets 320 are developed. It is to be noted that the threading dislocations developed in the (0002) growth direction in the spaces between the cones continue to turn over where facets 320 develop during growth. That is as the single crystalline GaN film 314 in the valley region over grows the columnar nanocrystalline gallium nitride (GaN) 316 on the cones, an inclined growth facet 320 is formed which in turn inclines dislocations toward the cones 302. This unique phenomena results in the termination and annihilation of threading dislocations which are thereby preventing them from propagating into the bulk of the film. Additionally, at this time the cones 302 are completely covered by columnar nanocrystalline GaN film 316 having a thickness between about 0.1-1.0 microns.

Figure 3E:
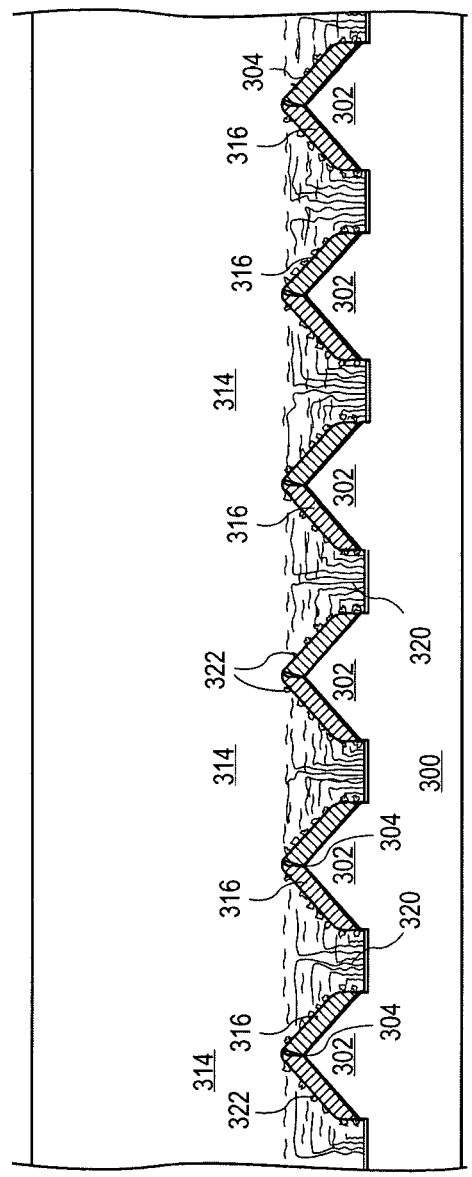

FIG. 3E is an illustration of the formation of the gallium nitride film (GaN) after approximately 10 minutes of deposition time. The single crystalline gallium nitride (GaN) film 314 is now mostly coalesced with no pitting over the cones 302. The single crystalline gallium nitride film 314 has a thickness of approximately 5.0 microns after about 10 minutes of deposition. A plurality of voids 322 have been formed at the interface between the single crystalline gallium nitride (GaN) film 314 and the over grown columnar nanocrystalline gallium nitride (GaN) 316 formed on the cone sidewalls 306. The voids 320 help eliminate stress in the single crystalline gallium nitride (GaN) film. Additionally, the nanocrystalline columnar structure of GaN film 316 itself releases stress by acting as a stress absorber. The voids 320 and columnar nanocrystalline gallium nitride layer 316 enable a bulk crack free single crystalline gallium nitride film 314 to be deposited. Additionally, because cone 306 has a sharp point no threading dislocations originate from the cone tip in the (0002) growth direction and extend into the bulk single crystalline GaN film 314. Still further, as shown in FIG. 3E, threading dislocations 320 incline towards the cones and do not extend much above the height of the cones. Accordingly, in order to insure that all threading dislocations are sufficiently suppressed, the single crystalline gallium nitride film 314 is ideally formed to a thickness of at least 3.0 microns. In this way a high quality low defect density single crystalline gallium nitride (GaN) film 314 is formed.

Figure 14A:
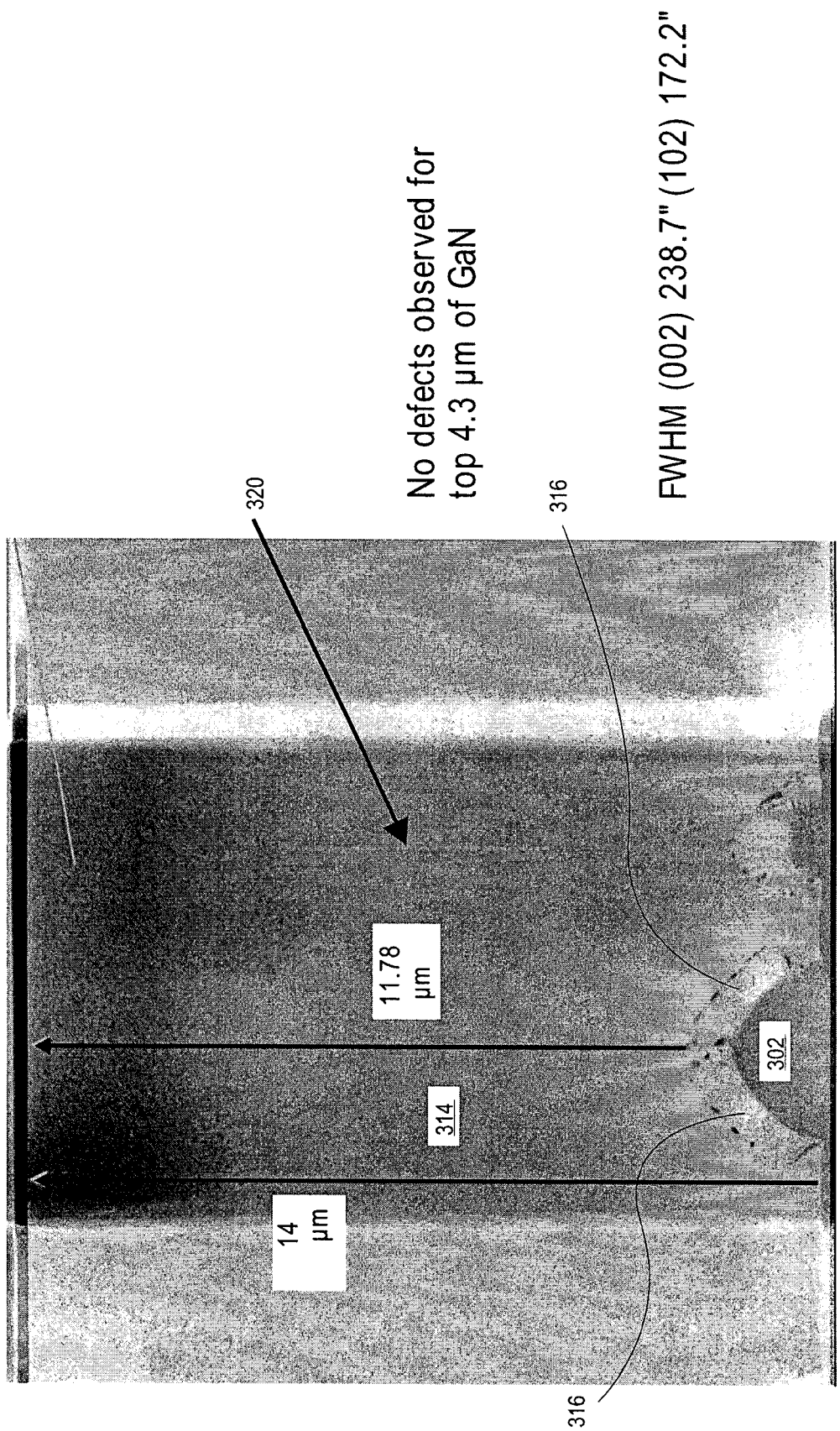
FIGS. 14A and 14B are transmission electron microscope (TEM) images of a gallium nitride film formed on a patterned sapphire substrate in accordance with embodiments of the present invention.
Figure 14B:
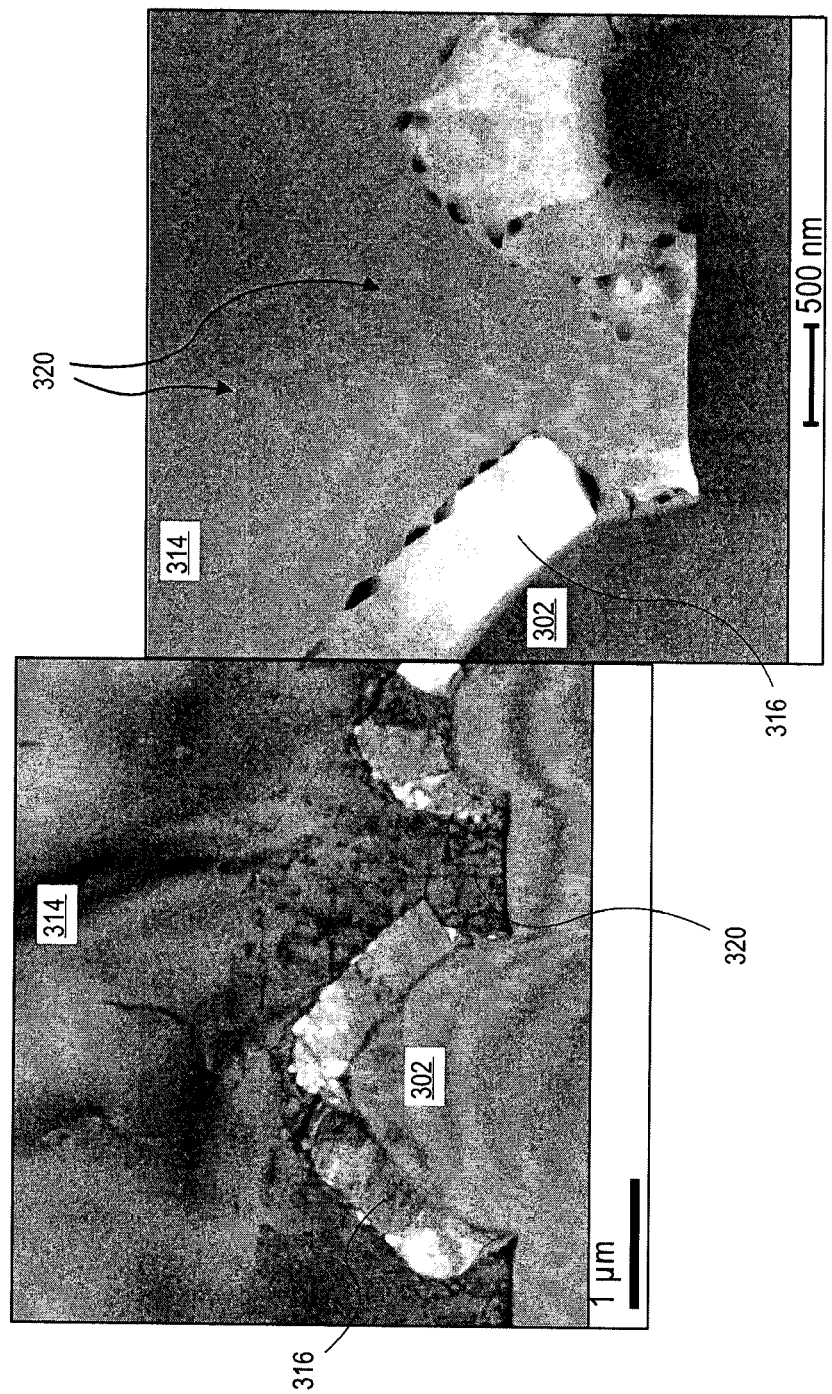

The deposition of single crystalline gallium nitride (GaN) 314 can continue until a desired thickness is reached. After about 20 minutes of deposition time an approximately 9.1 micron bulk single crystalline gallium nitride (GaN) film 314 is formed. Once the single crystalline gallium nitride film is formed to its desired thickness, the flow of the gallium source gas (e.g. GaCl) is turned off and the substrate temperature reduced as shown in FIG. 13. In an embodiment of the present invention the flow of $NH_3$ is continued, as shown in FIG. 13, after the gallium source gas is stopped and while the substrate sufficiently cools to a temperature such as less than 500° C. in order to prevent the thermal decomposition of the grown gallium nitride film. It is also to be noted that in an embodiment of the present invention ammonia ($NH_3$) is continuously provided into the reaction chamber during the entire deposition process, including nitridation, buffer layer formation, gallium nitride deposition and post deposition cool down. FIG. 14A is a transmission electron microscope (TEM) image of a single crystalline GaN film formed in accordance with an embodiment of the present invention showing only one threading dislocation away from the patterned substrate and no threading dislocations in the top 4.3 microns. Additionally, the (11-00) crystal orientated GaN film 316 is clearly visible on the sidewalls of features 302 in the TEM image of FIG. 14A. FIG. 14B is a TEM image showing the formation of columnar nanocrystalline gallium nitride film 316 on the sidewalls of features 302 and threading dislocations 320 formed in the (0002) growth direction of single crystalline gallium nitride layer 314 turning 90° towards the sidewalls of cone shaped features 302.

High resolution XRD confirms an extremely high crystalline, quality gallium nitride film resulting in a FWHM (002) and (102) of 239 and 172 arcsecs, respectively, for a 14 micron gallium nitride film on a PSS. Other samples demonstrated even better crystalline quality at FWHM (002) and (102) being 182 and 166 arcsecs, respectively, for a 7 micron thick gallium nitride (GaN) film grown on a PSS, 190 and 131 arcsecs for 9.5 micron thick GaN film grown on a PSS, as well as 181 and 125.3 arcsecs; 166.4 and 126 arcsecs for 10 micron thick GaN film grown on a PSS. Based on literature, the data should correspond to an etch pitch density in the range of $10^3$ to $10^4$ $cm^{-2}$ or less.

Additionally, the use of a sapphire substrate with a large, greater than 0.35° and generally between 0.35°-0.8° and ideally about 0.5°, cut-off angle from the c-plane enables a Group III-Nitride film with a thickness greater than seven microns to be grown with a very smooth, mirror like surface. The use of high cut-off angle patterned substrates along with the disclosed HVPE deposition conditions has achieved a single crystalline gallium nitride with a surface roughness levels RMS (1×1 um) of 0.35 nm and better, such as a RMS (1×1 um) of 0.31 nm for a 0.5° off-cut patterned sapphire substrate having 21 diameter/spacing ratio. The film also exhibited a Ra, of 0.24 nm and a Rmax of 3.87 nm.

In an embodiment of the present invention the gallium nitride film 314 is formed with at least a two different HVPE deposition conditions where the first set of conditions are tailored to increase or optimize the growth of the single crystalline gallium nitride film in the vertical or (0002) growth direction between features while the second set of conditions are tailored to increase or optimize the lateral or (1120) growth of the single crystalline gallium nitride film 314.

Figure 15:
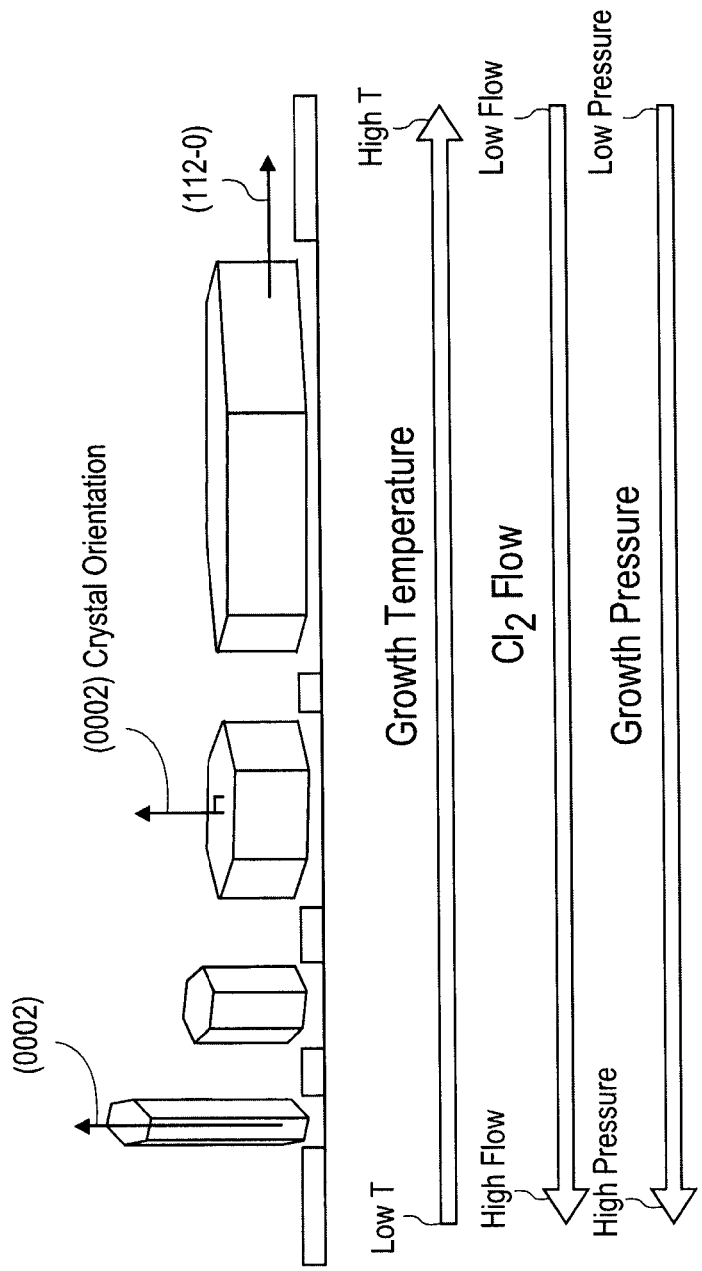
FIG. 15 is an illustration how deposition parameters of deposition temperature, deposition pressure and Cl2 flow over a Group III source each influence the vertical and lateral HVPE growth rates of a (0001) crystal orientated film.

FIG. 15 is an illustration of how deposition parameters of deposition temperature, deposition pressure and $Cl_2$ flow over a Group III source (e.g. a gallium source) each influence the vertical and lateral HVPE growth rates of a (0001) crystal orientated film. For example, as illustrated in FIG. 15, at lower HVPE deposition temperatures (i.e. substrate temperatures) a (0002) orientated Group III-Nitride film has a high vertical or (0002) growth rate and a low lateral or (112-0) growth rate. At high deposition temperatures, a (0002) orientated Group III-Nitride film has reduced vertical or (0002) growth rate and a higher lateral or (112-0) growth rate relative to low deposition temperatures. Similarly, FIG. 15 illustrates how at higher deposition pressures (i.e. reaction chamber pressures during deposition) a (0002) orientated Group III-Nitride film has a high vertical or (0002) growth rate and a low lateral or (112-0) growth rate. At lower deposition pressures a (0002) orientated Group III-Nitride film has a reduced vertical or (0002) growth rate and a higher lateral or (112-0) growth rate relative to high deposition pressures. Still further, FIG. 15 illustrates that at higher $Cl_2$ flows (i.e. $Cl_2$ flows over a Group III source) a (0002) orientated Group III-Nitride film has a high vertical or (0002) growth rate and a low lateral or (112-0) growth rate. At low $Cl_2$ flows a (0002) orientated Group III-Nitride film has a reduced vertical or (0002) growth rate and a higher lateral (112-0) growth rate relative to high $Cl_2$ flows.

In embodiments of the present invention, one or more of the deposition parameters of deposition temperature, deposition pressure and $Cl_2$ flow are manipulated during or after nucleation, colalescence and/or overgrowth portions of the Group III-Nitride film deposition process. In a specific embodiment, the deposition conditions are manipulated from a first deposition step to a second deposition step in order increase the lateral growth rate relative to the vertical growth rate with respect to the first deposition step relative to the second deposition step. In an alternative embodiment, one or more of the deposition parameters of deposition temperature, deposition pressure and $Cl_2$ flow are altered from a first deposition step to a second deposition step to provide an increased vertical growth rate relative to a lateral growth rate with respect to the first deposition step relative to the second deposition step.

In an embodiment of the present invention the first GaN HVPE deposition process utilizes a first deposition temperature and the second GaN HVPE deposition process utilizes a second higher deposition temperature. In an embodiment of the present invention the second deposition temperature is at least 5° C. and ideally at least 10° C. higher than the first deposition temperature. In another embodiment of the present invention the first GaN HVPE deposition process uses a first deposition pressure and the second GaN HVPE deposition process uses a second lower deposition pressure. In an embodiment of the present invention the second deposition pressure is at least 50 torr and ideally at least 150 torr lower than the first deposition pressure. In yet another embodiment of the present invention the first GaN HVPE deposition process uses a first $Cl_2$ flow over the gallium source and the second GaN HVPE deposition process uses a second lower $Cl_2$ flow over the gallium source. In an embodiment of the present invention the second $Cl_2$ flow is at least 10 SCCM and ideally at least 50 SCCM less than the first $Cl_2$ flow over the gallium source.

In still yet another embodiment the first GaN HVPE deposition process is preformed at a first deposition temperature, a first deposition pressure, and a first $Cl_2$ flow over the gallium source, and the second GaN HVPE deposition process uses a second deposition temperature, a second deposition pressure and a second $Cl_2$ flow rate over the gallium source, and wherein at least two of the process conditions set forth below are changed: i) the second deposition temperature is increased over the first deposition temperature; ii) the second deposition pressure is less than the first deposition pressure; and iii) the second $Cl_2$ flow rate over the gallium source is greater than the first $Cl_2$ flow rate. In still yet a further embodiment the temperature, pressure and $Cl_2$ flow rate are each changed as set forth above in order to increase the lateral growth rate of the second deposition step relative to the first deposition step.

In an embodiment of the present invention, the deposition parameters are changed once the gallium nitride film 314 has almost completely over grown the gallium nitride film 316 on sidewalls 306 but has not yet collaged as shown in FIG. 3D in order to increase the lateral growth rate (112-0) of the gallium nitride film 314 and assist in filling of pits 324. In an embodiment of the present invention, once pits 324 have been sufficiently filled, one or more of deposition temperature, deposition pressure, and $Cl_2$ flow are modified for a third deposition step to increase the vertical growth rate (0002) and enable the fast formation of a thick bulk film 314.

Figure 3F:
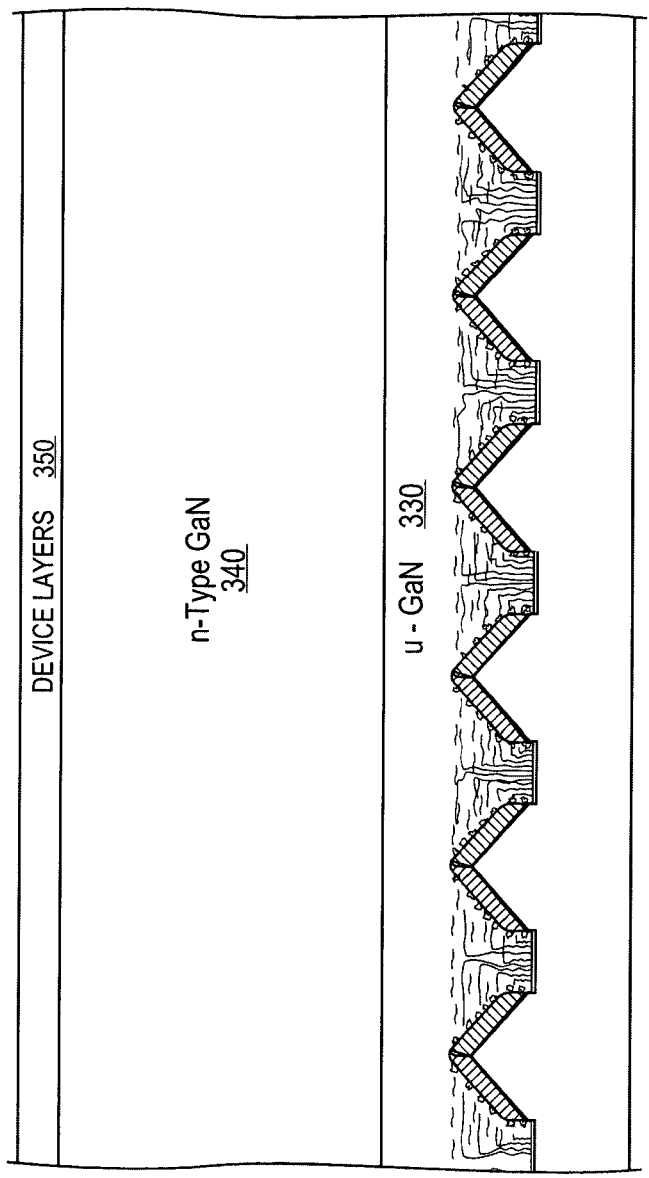

In embodiments of the present invention, after a sufficiently thick single crystalline gallium nitride layer 314 is formed, device layers 350 are then formed as illustrated in FIG. 3F. In a specific device a thick n type gallium nitride layer is required beneath the device layers. Accordingly, in an embodiment of the present invention, the single crystalline gallium nitride (GaN) film 14 is doped to an n type conductivity between $1 \times 10^{16}$ to $1 \times 1020$ atoms/cm$^3$ to provide an n type gallium nitride layer (n-GaN) 340. The gallium nitride layer 314 can be insitu doped to an n-type conductivity by providing an n-type dopant, such as silicon, during the deposition of the gallium nitride film. Silicon source gases such as but not limited to silane ($SiH_4$), dislane ($Si_2H_6$) and dichlorosilane ($SiH_2Cl_2$) may be used to insitu dope the gallium nitride film. In an embodiment of the present invention silane ($SiH_4$) is fed into the reaction chamber a rate of 100-200 SCCM to insitu dope gallium nitride layer 314 to from n-type gallium nitride layer 340. In an embodiment of the present invention an additional flow of 5-50 SCCM of $Cl_2$ is fed into the chamber while silane is fed into the chamber in order to form silicon tetrachloride ($SiCl_4$). The n type gallium nitride layer 340 can be directly deposited onto the buffer layer/sapphire substrate or alternatively an undoped single crystalline gallium nitride layer 330 can be formed prior to the n type gallium nitride layer. In specific embodiment, a undoped single crystalline gallium nitride layer 330 is formed to a thickness of about 2.5 microns and than a n-type single crystalline gallium nitride film 340 having a thickness up to about 24 microns is formed on the undoped gallium nitride layer 330 as shown in FIG. 3F.

In an embodiment of the present invention device layers 350 contain layers used to form a light emitting diode (LED). In a specific embodiment the device layers include a n-type contact layer which can be formed from the n type gallium nitride layer, an active region, an electron blocking layer and a p-type contact layer. The active region can include a single or multiple quantum wells, such as InGaN, formed on a single or multiple barrier layers, such as GaN. In one embodiment of the present invention the device layers are formed by HVPE and insitu with the bulk gallium nitride layers 330/340. In another embodiment the device layers are formed in a different chamber and by a different deposition technique, such as MOCVD. In an embodiment of the present invention the bulk single crystalline gallium nitride (GaN) layers are formed in an HVPE chamber and the device layers are formed in a MOCVD chamber and where the MOCVD chamber and the HVPE chamber are coupled together by a transfer chamber of a cluster tool to enable the transfer of wafers and the deposition of films without the need to expose the substrates to an outside ambient between deposition steps. In a specific embodiment the cluster tool contains one HVPE chamber and two MOCVD chambers to balance throughput.

As set forth above, although the embodiments of the present invention have been described with respect to a specific embodiment of forming a bulk gallium nitride film the present invention is equally applicable to other Group III-Nitrides, and specifically aluminum nitride (AlN) and indium nitride (InN). A bulk single crystalline aluminum nitride film can be formed by HVPE by heating the substrate to a temperature between 1100°-1300° C. and generating a chamber pressure between 100-500 torr and providing a source of aluminum, such as aluminum trichloride ($AlCl_3$), and a source of Nitrogen, such as ammonia ($NH_3$) into the chamber. The $AlCl_3$ precursor can be formed by flowing 50-500 SCCM of $Cl_2$ over a boat containing aluminum heated to a temperature of about 550° C. A $N_2$ carrier gas at a flow of 5-25 SLM can be provided "post boat" to carry the $AlCl_3$ precursor into the chamber. The $NH_3$ can be provided at a flow of 15-30 SLM. An $N_2$ carrier gas at a flow of 3-6 SLM can also be provided to carry the $NH_3$ into the chamber. A bulk single crystalline indium nitride (InN) film can be formed by HVPE by heating the substrate to a temperature between 550°-700° C. and generating a chamber pressure between 100-500 torr and providing a source of indium, such as indium trichloride ($InCl_3$), and a source of Nitrogen, such as ammonia ($NH_3$) into the chamber. The $InCl_3$ precursor can be formed by flowing 10-200 SCCM of $Cl_2$ over a boat containing indium heated to a temperature of about 550° C. A $N_2$ carrier gas at a flow of 5-25 SLM can be provided "post boat" to carry the $InCl_3$ precursor into the chamber. The $NH_3$ gas can be provided at a flow of 15-30 SLM. An $N_2$ carrier gas can also be provided to carry the $NH_3$ into the chamber.

Although specific process parameters have been set forth above which can be used to form single crystalline GaN, AlN and InN films, and ternary an quaternary versions thereof, any suitable HVPE deposition technique may be utilized to form Group III-Nitride crystalline film 108 as long as it is able to form a Group III-Nitride film with a first crystal orientation in spaces between features and with a second crystal orientation on angled sidewalls of features of a patterned substrate. In one embodiment, the Group III-Nitride film is formed by reacting a Group III metal containing precursor gas and a nitrogen containing precursor gas, such as NH$_3$, near the surface of the substrate. In one embodiment, the Group III metal containing precursor gas is formed by providing a metal source which includes any suitable Group III metal source, such as gallium, aluminum or indium with the particular metal or metals selected based on the particular application. A halide or halogen gas is then fed over the metal source and reacted with the metal source to form a gaseous Group III metal containing precursor. In one embodiment, HCl reacts with a liquid gallium to form gaseous gallium chloride (GaCl). In another embodiment, Ch reacts with liquid gallium to form GaCl and GaCl3. In some cases chlorides such as GaCl$_3$, AlCl$_3$, and InCl$_3$ could be used as precursors instead of metal sources. Additional embodiments of the invention utilize other halides or halogens to attain a Group III metal-containing gas phase precursor. Suitable hydrides include those with composition HX (e.g., with X=Cl, Br, or I) and suitable halogens include Cl$_2$, Br$_2$ and I$_2$. For halides, the unbalanced reaction equation is:

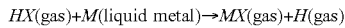

where X=Cl, Br, or I and M=Ga, Al, or In. For halogens the equation is:

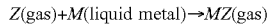

where Z=Cl$_2$, Br$_2$ I$_2$ and M=Ga, Al, or In. Hereafter the gaseous metal containing species will be referred to as the "Group III metal containing precursor" (e.g., metal chloride).

The Group III metal containing precursor gas and the nitrogen containing gas, such as ammonia, are then fed into a chamber and reacted together near the surface of the substrate to deposit the Group III metal nitride film on the substrate. In an embodiment of the present invention, the chamber is maintained at a pressure between 10 torr and 760 torr. In one embodiment, the chamber is maintained at a pressure of about 450 torr to about 760 torr. Additionally, during deposition of the Group III metal nitride film, the substrate is heated to a temperature of about 500° C. to about 1200° C. The Group III metal nitride film is deposited on the substrate at the rate of about 1 micron per hour to about 100 microns per hour, but higher growth rate is achievable. In one embodiment, the deposition rate is about 15 microns per hour to about 25 microns per hour. An n type doped film can be formed by providing a n type dopant containing precursor such as but not limited to silane (SiH$_4$) and disilane (Si$_2$H$_6$). Similarly, a p type doped film can be formed by providing a p type dopant containing precursor such as but not limited to biscyclopentadienyl maganesium (Cp$_2$Mg).

An example of a HVPE deposition chamber which may be utilized to deposit the Group III-Nitride film in accordance with the present invention is illustrated and described with respect to FIGS. 4-11.

Figure 4:
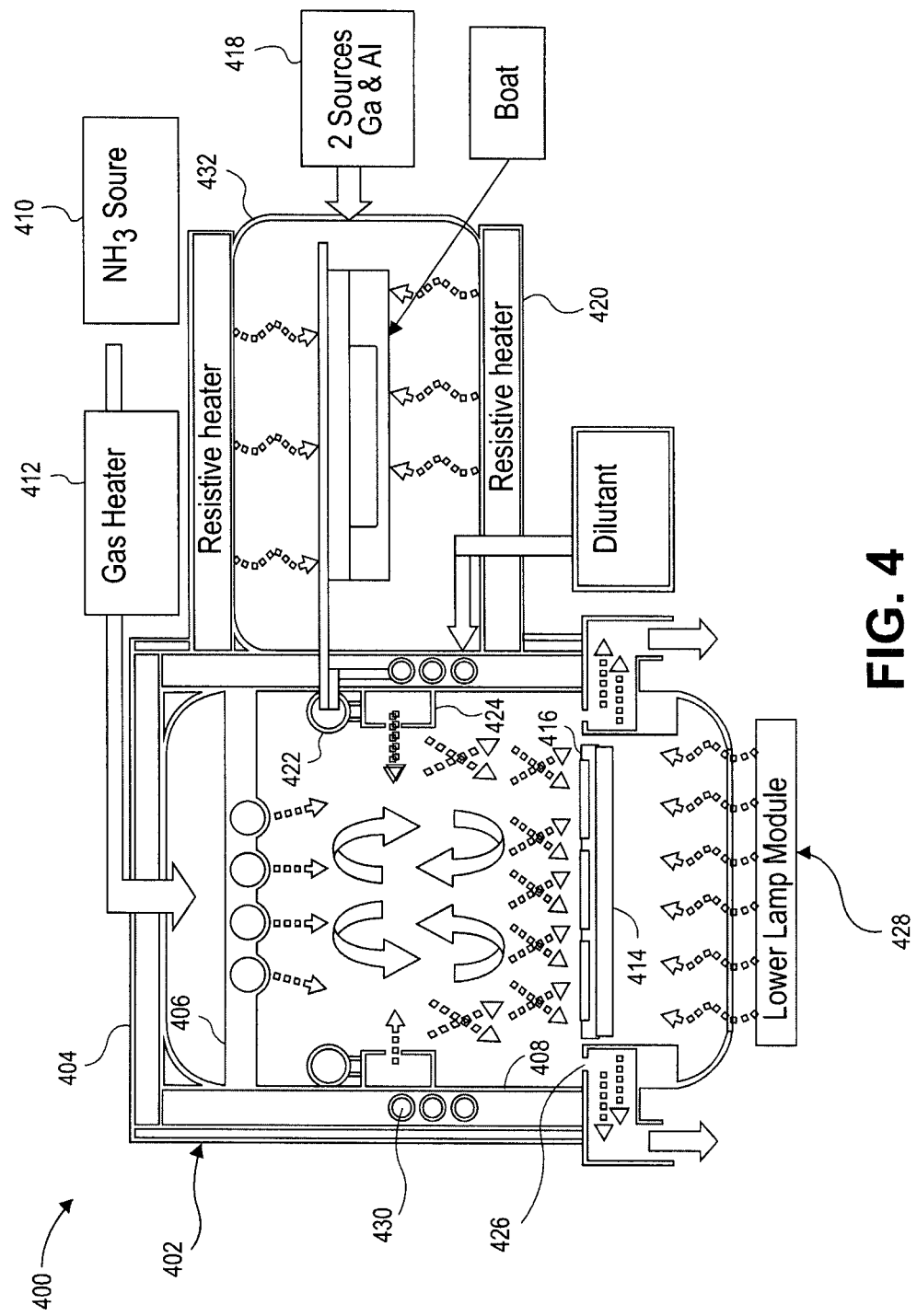
FIG. 4 is a schematic view of an HVPE apparatus 400 according to one embodiment.

FIG. 4 is a schematic view of an HVPE apparatus 400 according to one embodiment. The apparatus includes a chamber 402 enclosed by a lid 404. Processing gas from a first gas source 410 is delivered to the chamber 402 through a gas distribution showerhead 406. In one embodiment, the gas source 410 may comprise a nitrogen containing compound. In another embodiment, the gas source 410 may comprise ammonia. In one embodiment, an inert gas such as helium or diatomic nitrogen may be introduced as well either through the gas distribution showerhead 406 or through the walls 408 of the chamber 402. An energy source 412 may be disposed between the gas source 410 and the gas distribution showerhead 406. In one embodiment, the energy source 412 may comprise a heater. The energy source 412 may break up the gas from the gas source 410, such as ammonia, so that the nitrogen from the nitrogen containing gas is more reactive.

To react with the gas from the first source 410, precursor material may be delivered from one or more second sources 418. The one or more second sources 418 may comprise precursors such as gallium and aluminum. It is to be understood that while reference will be made to two precursors, more or less precursors may be delivered as discussed above. In one embodiment, the precursor comprises gallium present in the precursor source 418 in liquid form. In another embodiment, the precursor comprises aluminum present in the precursor source 418 in solid form. In one embodiment, the aluminum precursor may be in solid, powder form. The precursor may be delivered to the chamber 402 by flowing reactive gas over and/or through the precursor in the precursor source 418. In one embodiment, the reactive gas may comprise a chlorine containing gas such as diatomic chlorine. The chlorine containing gas may react with the precursor source such as gallium or aluminum to form a chloride.

In order to increase the effectiveness of the chlorine containing gas to react with the precursor, the chlorine containing gas may snake through the boat area in the chamber 432 and be heated with the resistive heater 420. By increasing the residence time that the chlorine containing gas is snaked through the chamber 432, the temperature of the chlorine containing gas may be controlled. By increasing the temperature of the chlorine containing gas, the chlorine may react with the precursor faster. In other words, the temperature is a catalyst to the reaction between the chlorine and the precursor.

In order to increase the reactiveness of the precursor, the precursor may be heated by a resistive heater 420 within the second chamber 432 in a boat. For example, in one embodiment, the gallium precursor may be heated to a temperature of between about 750° C. to about 850° C. The chloride reaction product may then be delivered to the chamber 402. The reactive chloride product first enters a tube 422 where it evenly distributes within the tube 422. The tube 422 is connected to another tube 424. The chloride reaction product enters the second tube 424 after it has been evenly distributed within the first tube 422. The chloride reaction product then enters into the chamber 402 where it mixes with the nitrogen containing gas to form a nitride layer on the substrate 416 that is disposed on a susceptor 414. In one embodiment, the susceptor 414 may comprise silicon carbide. The nitride layer may comprise gallium nitride or aluminum nitride for example. The other reaction product, such as nitrogen and chlorine, are exhausted through an exhaust 426.

The chamber 402 may have a thermal gradient that can lead to a buoyancy effect. For example, the nitrogen based gas is introduced through the gas distribution showerhead 406 at a temperature between about 450° C. and about 550° C. The chamber walls 408 may have a temperature of about 600° C. to about 800° C., but preferably 700° C. The susceptor 414 may have a temperature of about 600° C. to about 1150° C. Thus, the temperature difference within the chamber 402 may permit the gas to rise within the chamber 402 as it is heated and then fall as it cools. The rising and falling of the gas may cause the nitrogen gas and the chloride gas to mix. Additionally, the buoyancy effect will reduce the amount of gallium nitride or aluminum nitride that deposits on the walls 408 because of the mixing.

The heating of the processing chamber 402 is accomplished by heating the susceptor 414 with a lamp module 428 that is disposed below the susceptor 414. During deposition, the lamp module 428 is the main source of heat for the processing chamber 402. While shown and described as a lamp module 428, it is to be understood that other heating sources may be used. Additional heating of the processing chamber 402 may be accomplished by use of a heater 430 embedded within the walls 408 of the chamber 402. The heater 430 embedded in the walls 408 may provide little if any heat during the deposition process. A thermocouple may be used to measure the temperature inside the processing chamber. Output from the thermocouple may be fed back to a controller that controls the heating of the heater 430 based upon the reading from the thermocouple. For example, if the chamber is too cool, the heater 430 will be turned on. If the chamber is too hot, the heater 430 is be turned off. Additionally, the amount of heating from the heater 430 may be controlled such that a low amount of heat is provided from the heater 430.

After the deposition process, the substrate 416 is normally taken out of the processing chamber 402. The lamp module 428 is turned off. Within the heat from the lamp module 428, the chamber 402 may rapidly cool. The gallium nitride or aluminum nitride that may have deposited on the walls 408 may have a different coefficient of thermal expansion than the walls 408 themselves. Thus, the gallium nitride or the aluminum nitride may flake off due to thermal expansion. To prevent undesired flaking, the heater 430 embedded within the chamber walls 408 may be turned on to control the thermal expansion and maintain the chamber 402 at the desired chamber temperature. The control of the heater 430 may again be based upon real time feedback from the thermocouple. Once the lamp module 428 is turned off, the heater 430 may be turned on or up to maintain the temperature of the chamber 402 at the desired temperature so that gallium nitride or aluminum nitride may not flake off and contaminate the substrate or land on the susceptor 414 and create an uneven susceptor 414 surface. By maintaining the chamber walls 408 at an elevated temperature, the chlorine will be more effective in cleaning the depositions from the chamber walls 408.

In general, a deposition process will proceed as follows. A substrate 416 may initially be inserted into the processing chamber 402 and disposed on the susceptor 414. In one embodiment, the substrate 416 may comprise sapphire. The lamp module 428 may be turned on to heat the substrate 416 and correspondingly the chamber 402. Nitrogen containing reactive gas may be introduced from a first source 410 to the processing chamber. The nitrogen containing gas may pass through an energy source 412 such as a gas heater to bring the nitrogen containing gas into a more reactive state. The nitrogen containing gas then passes through the chamber lid 404 and the gas distribution showerhead 406. In one embodiment, the chamber lid 404 may be water cooled.

A precursor may also be delivered to the chamber 402. A chlorine containing gas may pass through and/or over the precursor in a precursor source 418. The chlorine containing gas then reacts with the precursor to form a chloride. The chloride is heated in with a resistive heater 420 in the source module 432 and then delivered into an upper tube 422 where it evenly distributes within the tube 422. The chloride gas then flows down into the other tube 424 before it is introduced into the interior of the chamber 402. It is to be understood that while chlorine containing gas has been discussed, the invention is not to be limited to chlorine containing gas. Rather, other compounds may be used in the HVPE process. The chamber walls 418 may have a minimal amount of heat generated from the heater 430 embedded within the walls 418. The majority of the heat within the chamber 420 is generated by the lamp module 428 below the susceptor 414.

Due to the thermal gradient within the chamber 402, the chloride gas and the nitrogen containing gas rise and fall within the processing chamber 402 and thus intermix to form a nitride compound that deposited on the substrate 416. In addition to depositing on the substrate 416, the nitride layer may deposit on other exposed areas of the chamber 402 as well. The gaseous reaction produces of the chloride compound and the nitrogen containing gas may include chlorine and nitrogen which may be evacuated out of the chamber thought the exhaust 426.

Once the deposition process is completed, the lamp module 428 may be turned off and the heater 430 output may be increased. The substrate 416 may be removed. The heater 430 output reduces or eliminates thermal expansion and thus any deposited nitride material may remain in place until the desired cleaning time and not flake off of the walls 408 and land on the susceptor 414 of incoming/outgoing substrate 416. Once the deposition process is completed, any nitride that has deposited on the walls 408 may be removed by introducing an etchant to etch the nitride off of the walls 408. During the cleaning, the lamp module 428 may be turned off and the majority of the heat may be from the heater 430 embedded within the walls 408. Once a new substrate is placed into the chamber 402, the process may be repeated.

While the nitrogen containing gas is discussed as being introduced through the gas distribution showerhead 406 and the precursor delivered in the area corresponding to the middle of the chamber 402, it is to be understood that the gas introduced locations may be reversed. However, if the precursor is introduced through the showerhead 406, the showerhead 406 may be heated to increase the reactiveness of the chloride reaction product.

Because the chloride reaction product and the ammonia are delivered at different temperatures, delivering the ammonia and the chloride reaction product through a common feed may be problematic. For example, if a quartz showerhead were used to feed both the ammonia and the chloride reaction product, the quartz showerhead may crack due to the different temperatures of the ammonia and the chloride reaction product.

Additionally, the deposition process may involve depositing a thin aluminum nitride layer as a seed layer over the sapphire substrate followed by a gallium nitride layer. Both the gallium nitride and the aluminum nitride may be deposited within the same processing chamber. Thereafter, the sapphire substrate may be removed and placed into an MOCVD processing chamber were another layer may be deposited. In some embodiments, the aluminum nitride layer may be eliminated. Where both an aluminum nitride layer and a gallium nitride layer are deposited within the same chamber, a diatomic nitrogen back flow may be used to prevent any of the other precursor from reacting with chlorine and forming a chloride reaction product. The diatomic nitrogen may be flowed into the chamber of the precursor not being reacted while the chlorine may be flowed into contact with the other precursor. Thus, only one precursor is reacted at a time.

Figure 5:
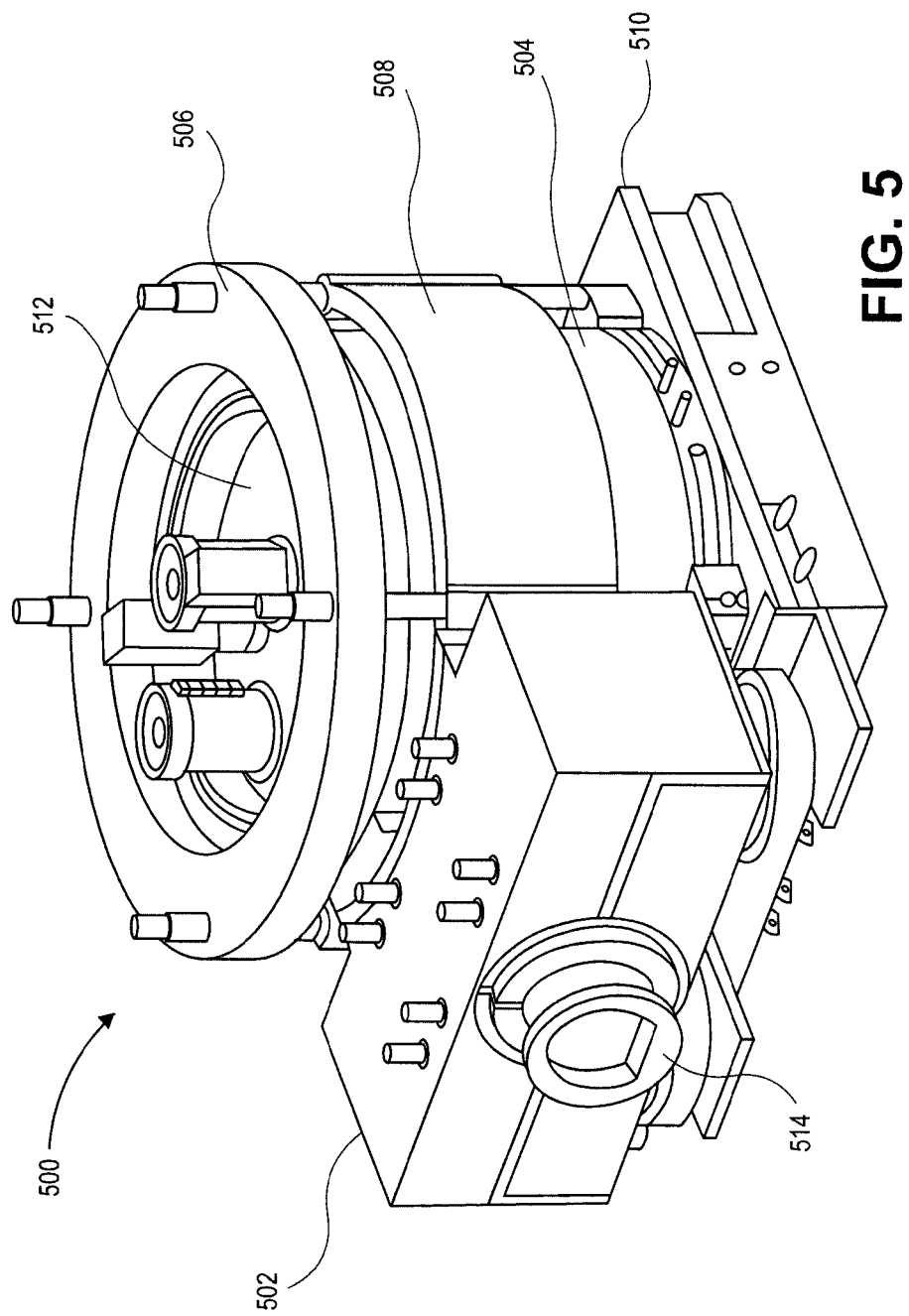
FIG. 5 schematic isometric view of an apparatus 500 according to another embodiment.

FIG. 5 schematic isometric view of an apparatus 500 according to another embodiment. The apparatus 500 includes a precursor source 502 or boat that is coupled to the chamber 504. The chamber 504 is enclosed by a lid 512 and held in place by a clamp 506, bottom 510 and enclosure 508. The chlorine containing gas is introduced to the precursor source 502 through a passageway 514. The chlorine containing gas snakes through the passageway 514 prior to coming into contact with the precursor so that the temperature of the chlorine containing gas may be raised to a predetermined temperature suitable to optimally react with the precursor.

Figure 6A:
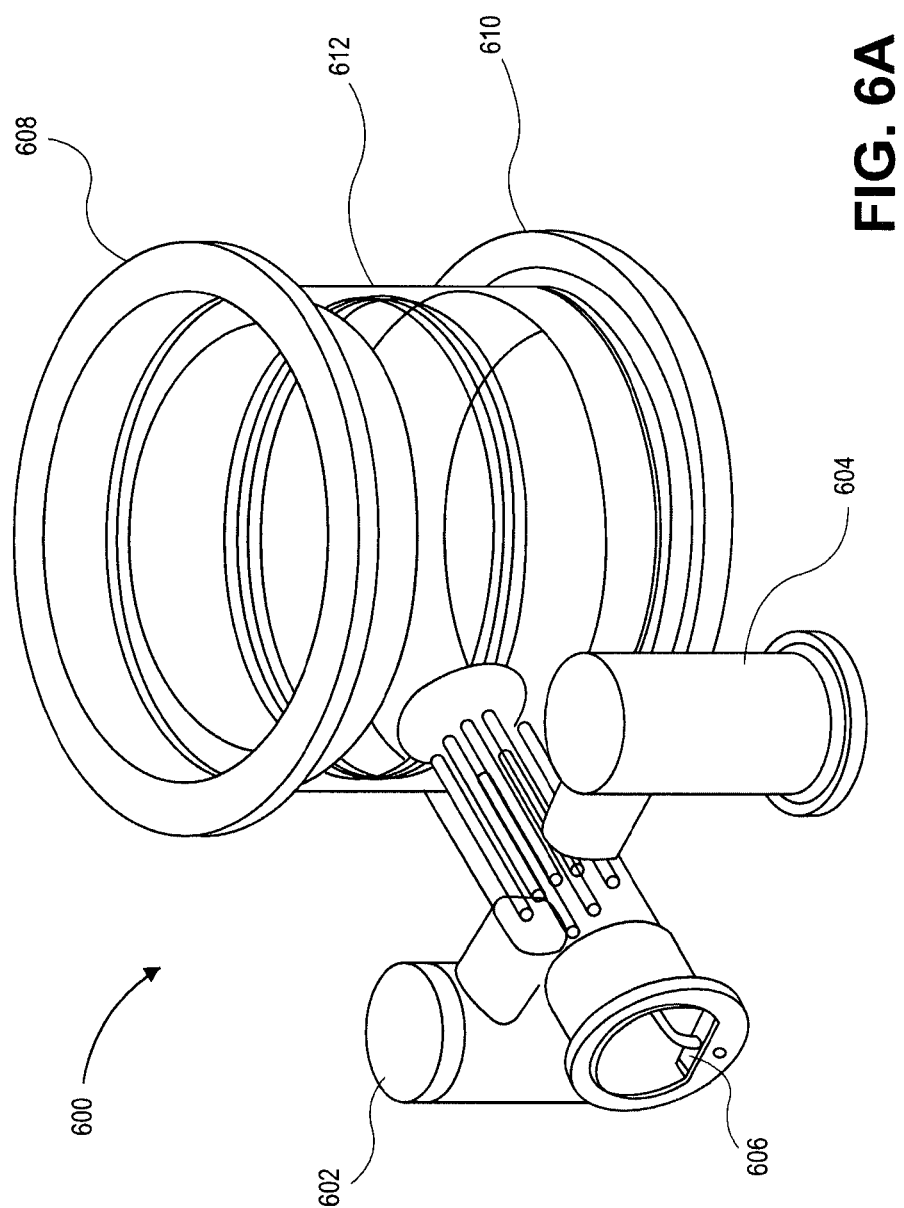
FIG. 6A is a schematic isometric view of a processing chamber 600 according to another embodiment.
Figure 6B:
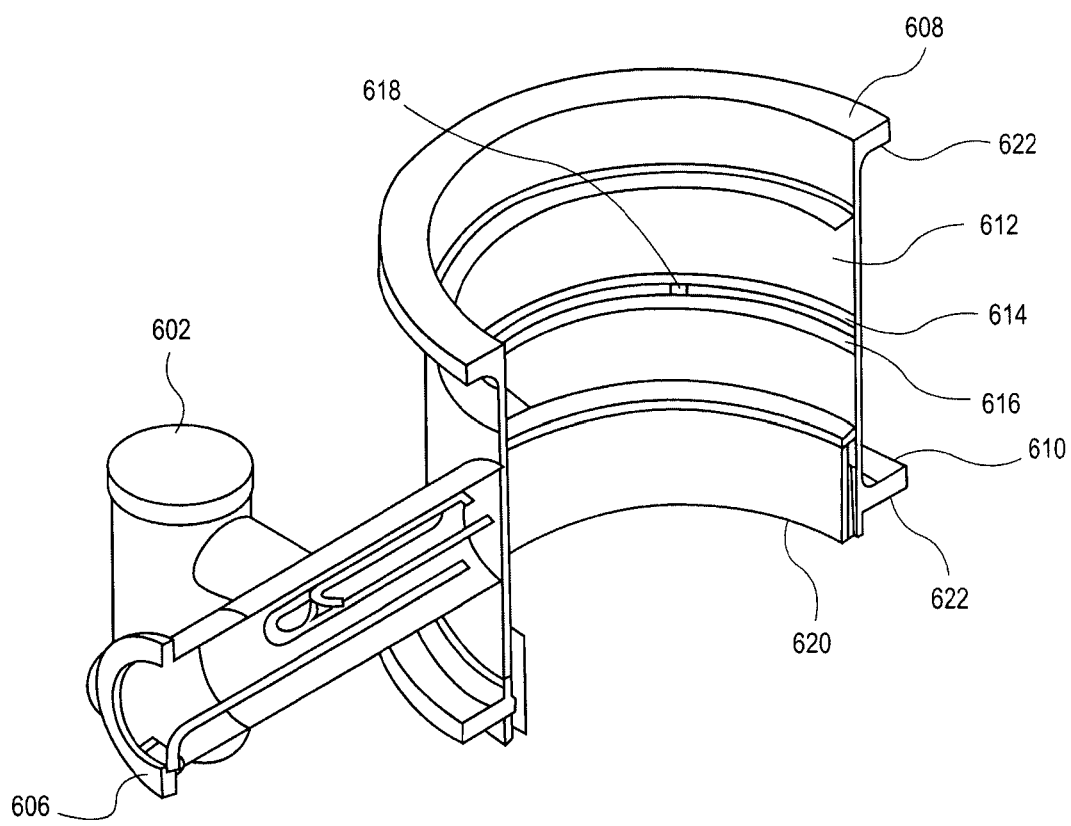
FIG. 6B is a schematic cross sectional view of FIG. 6A.

FIG. 6A is a schematic isometric view of a processing chamber 600 according to another embodiment. The processing chamber 600 includes a first precursor source 602, a second precursor source 604, a passageway 606 for the chlorine gas to pass, an upper ring 608, a lower ring 610, and sidewalls 612. FIG. 6B is a schematic cross sectional view of FIG. 6A. The chloride reaction produce may enter the chamber through a first upper tube 614 and then evenly distribute therein before flowing to a second tube 616 through connectors 618 that are distributed between the tubes 614, 616. In one embodiment, the upper and lower rings 608, 610 comprise opaque quartz. In one embodiment, the walls 612 may comprise clear quartz. In another embodiment, the tubes 614, 616 may comprise clear quartz. The lower liner 620 may comprise opaque quartz. The rings 608, 610 may have lips 622 that extend out from the walls 612. O-rings may be disposed out at the edge of the lips 622 to ensure that the O-rings are as far away from the heated chamber walls 612 and lamp module as possible. O-rings typically are usable up until about 250° C. Therefore, moving the O-rings away from the chamber body is beneficial.

Figure 7:
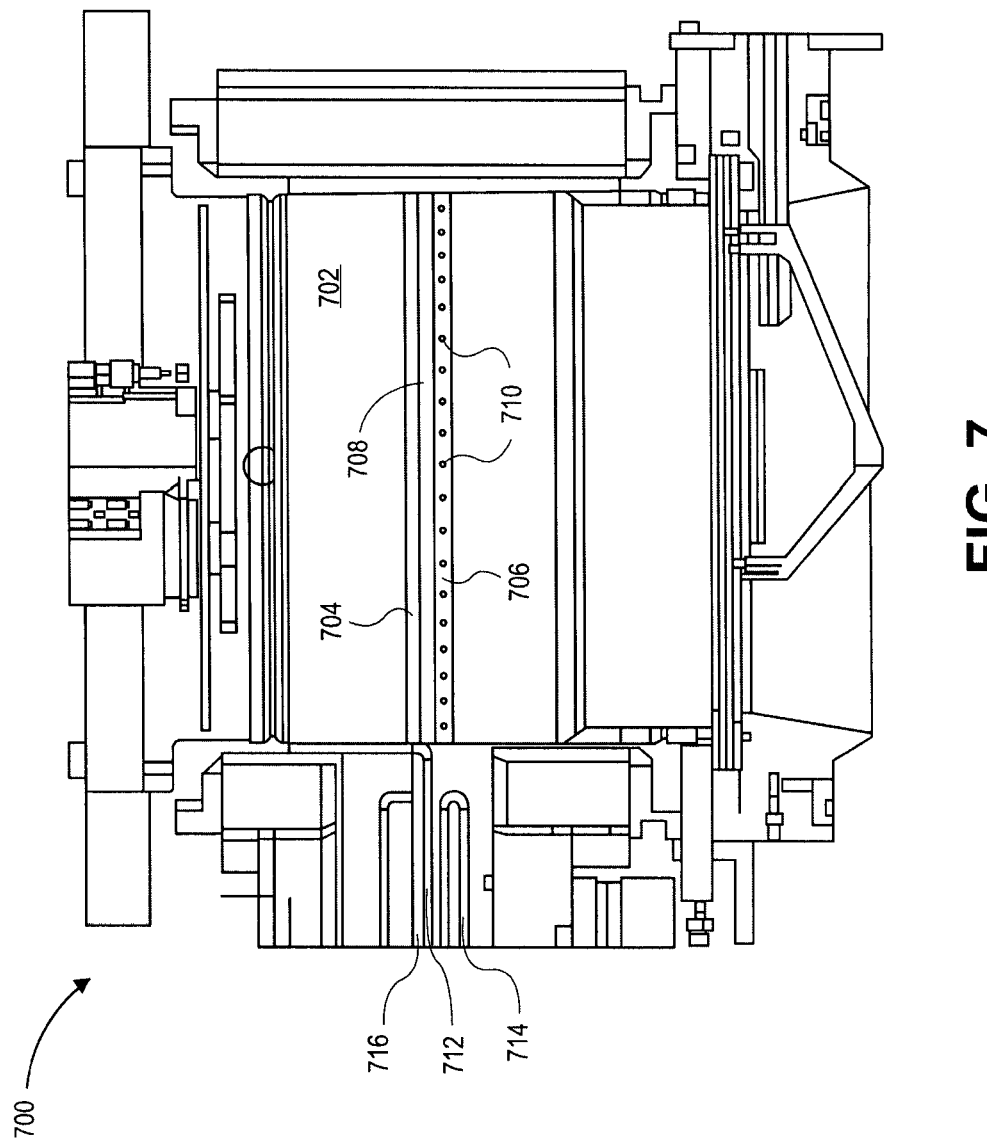
FIG. 7 is a schematic cross sectional view of a processing chamber 700 according to another embodiment.

FIG. 7 is a schematic cross sectional view of a processing chamber 700 according to another embodiment. The processing chamber 700 includes a chamber wall 702 having a first tube 704 coupled thereto. The first tube 704 is the tube into which the chloride reaction product initially flows before being released into the chamber. The tube 704 is coupled to a second tube 706 via one or more connectors 708. The tube 710 has a plurality of openings 710 therethrough to permit the chloride reaction product to enter into the processing space. The chloride gas is formed by initially introducing a chlorine containing gas into the precursor source or boat and flowed within the passage 716. The chlorine containing gas snakes around in the passage within tubes 714. The passage 716 is heated by the resistive heaters described above. Thus, the chlorine containing gas increases in temperature before coming into contact with the precursor. Once the chlorine comes into contact with the precursor, a reaction takes place to form a chloride reaction product that is flowed through the passage 716 in gas feed 712 that is coupled to the tube 714. Then, the chloride reaction product is evenly distributed and then disposed into the processing chamber 700.

Figure 8:
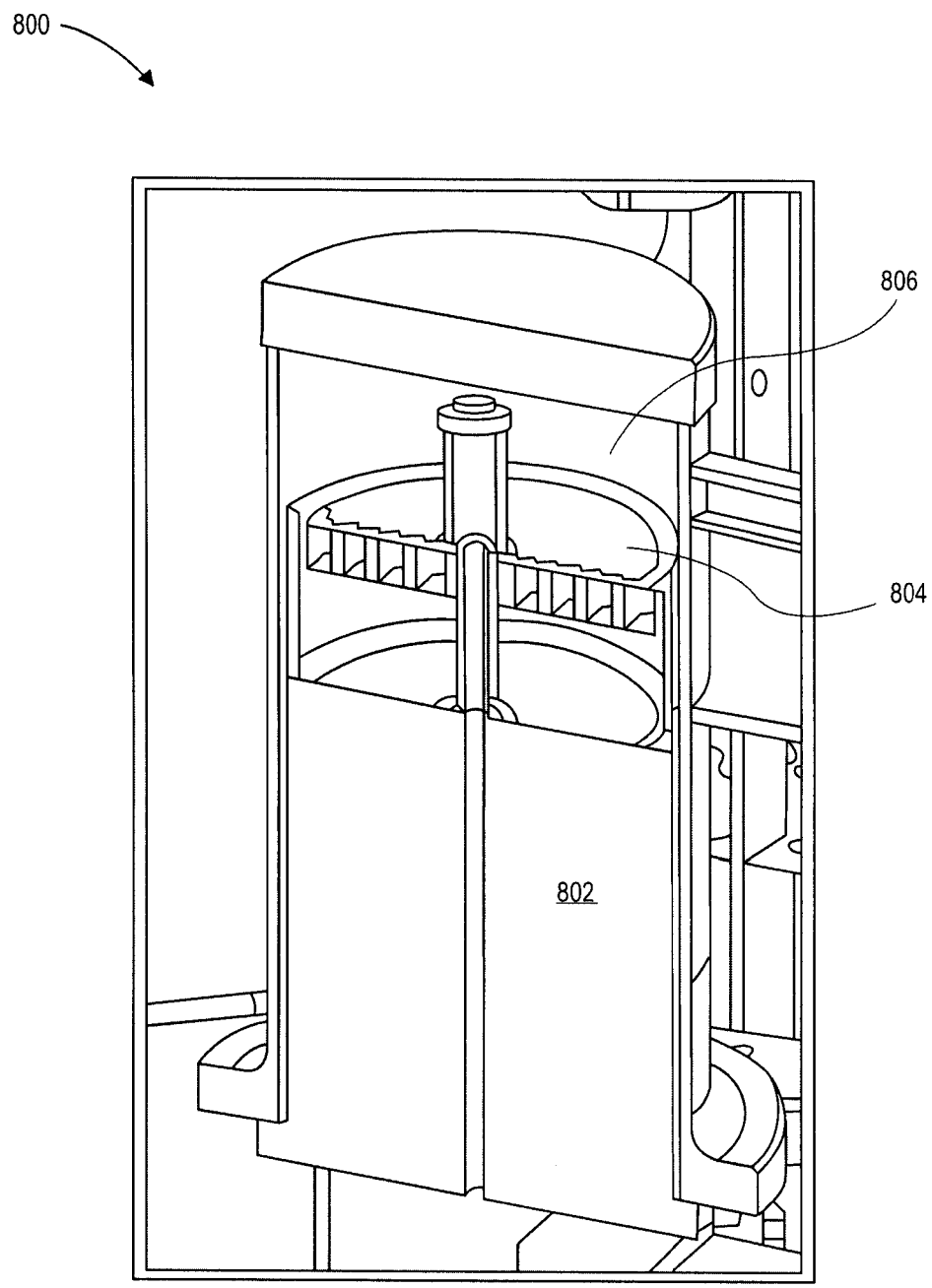
FIG. 8 is a schematic cross sectional view of a precursor source 800 according to one embodiment.

FIG. 8 is a schematic cross sectional view of a precursor source 800 according to one embodiment. In the embodiment discussed herein, the precursor is gallium, however, it is to be understood that the description is applicable to any liquid precursor. The precursor source 800 includes the precursor 802 itself with a float 804 thereon. The float 804 is the item that the chlorine gas flows through to come into contact with the precursor 802. As the chlorine comes into contact with the precursor, some of the precursor 802 will be used. Thus, the liquid level will drop over time. As such, the float 804 will move down and float on the precursor 802 such that the exposure of chlorine gas to the precursor 802 is substantially the same even as the level of the precursor 802 drops. The area 806 above the float 804 may increase as the precursor 802 decreases. The materials for the float 804 may comprise PbN to eliminate quartz exposure to gallium.

Figure 9:
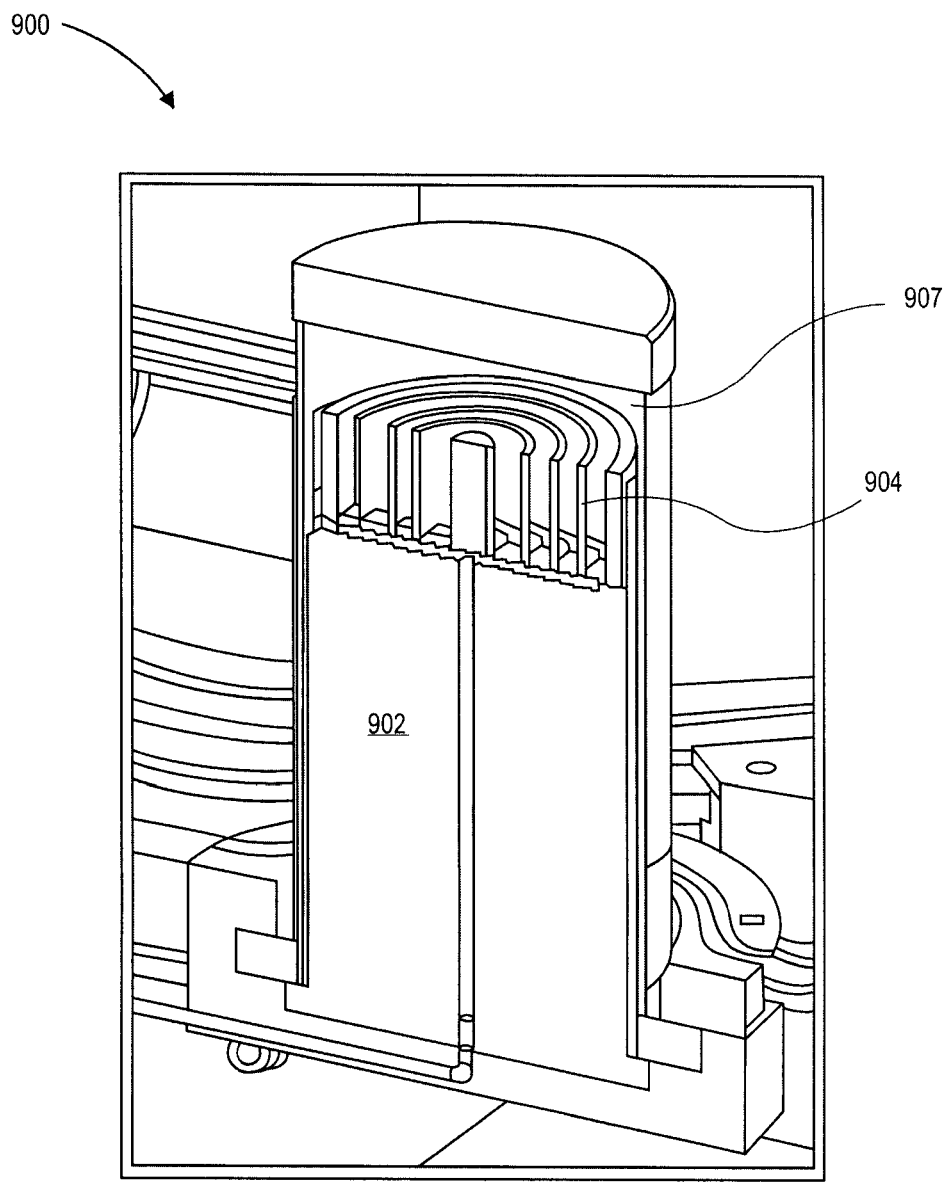
FIG. 9 is a schematic cross sectional view of a precursor source 900 according to another embodiment.

FIG. 9 is a schematic cross sectional view of a precursor source 900 according to another embodiment. While the description will be made with reference to a solid, powder aluminum precursor, it is to be understood that the precursor may be any solid precursor. The precursor 902 is below the labyrinth 904 through which the chlorine gas flows to come into contact with the precursor 902. The labyrinth increases the residence time that the chlorine gas is exposed to the precursor 902 so that an optimal amount of precursor 902 may be delivered to the processing chamber. As the labyrinth 904 is not a float, the area 906 above the labyrinth 904 is not expected to increase over time.

Figure 10:
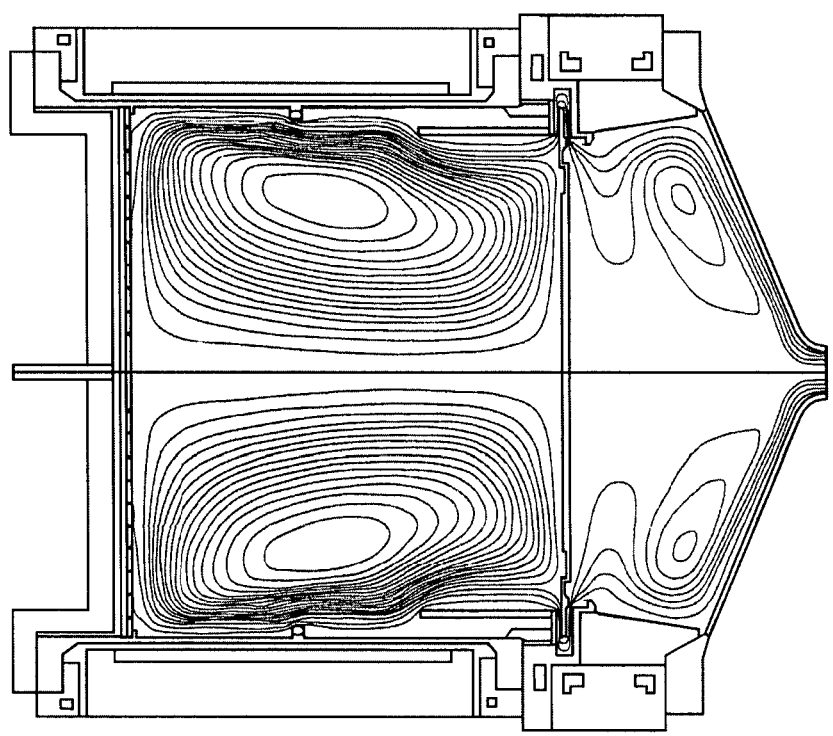
FIG. 10 is a schematic illustration of the buoyancy within the processing chamber according to one embodiment.
Figure 11:
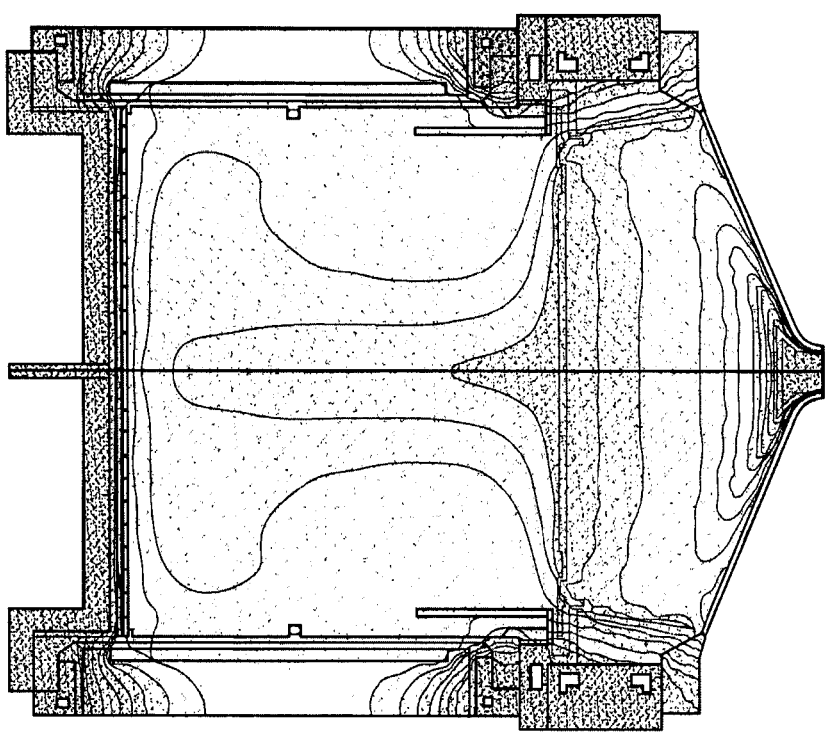
FIG. 11 is a schematic illustration of the heat distribution within the processing chamber according to one embodiment.

FIG. 10 is a schematic illustration of the buoyancy within the processing chamber according to one embodiment. As shown by the lines, the gas flow within the chamber is cyclical such that the gas rises from the bottom of the chamber, mixes, and then sinks towards the bottom of the chamber as the temperature has cooled. FIG. 8 is a schematic illustration of the heat distribution within the processing chamber according to one embodiment. As shown in FIG. 11, the temperature distribution is substantially symmetrical about an axis, but there is a temperature gradient from the bottom of the chamber to the top of the chamber.

The embodiments discussed herein relate to a hot wall HVPE CVD reactor design that minimizes wall deposition while any deposited films adhered to the chamber wall are adhered well enough to manage defects on the product substrate. The chamber is configured such that two reactive gases may be introduced separately at desired preheated temperatures. The gas injection was designed such that the two gases mix mainly away from the wall, but provide enough diffusion length, volume and buoyancy to ensure ideal premixing and produce high quality films.

The chamber design includes a hot wall HVPE reactor with multiple heating zones to manage the wall temperature and gradient, a bottom lamp for fast wafer temperature ramp up and down, a HVPE boat structure that interfaces directly to the chamber interior with optional dilution capabilities, and a chamber structure that promotes buoyancy flow. The chamber design permits a method to inject reactive gases into the main stream of the flow. The chamber design also includes a gas injection method to allow main gas mixing to occur in the gas volume away from the wall, a substrate heater for rapid temperate ramp up and down, a top heater for temperature gradient control, and a gas injection separated such that mixing and buoyancy effect are achieved. The apparatus also includes multiple metal sources heated by an independent heater and control, quartz or ceramic walls that incorporate the showerhead features. Helium may be used instead of nitrogen as the dilution gas to keep the gases at a higher temperature. The top ammonia/nitrogen gas or ammonia/helium gas can be heated to make the ammonia more reactive using a gas heater or heated labyrinth design with multiple plates. The top nitrogen source and the dilutant can be activated by an energy source such as a gas heater. The reactive gas may be flowed over the metal source boat that is preheated or activated with an energy source. The susceptor may be rotated for better gas distribution. A plate may be used to guide the gas mixture to the edge of the substrate. Also, the exhaust may be placed at the peripheral of the substrate or the upper part of the chamber where the heated gas may be exhausted.

Thus, a method of forming a high quality low defect density Group III-Nitride epitaxial film has been described.

The invention claimed is:

1. A semiconductor device comprising:
   a patterned substrate having a plurality of spaced apart features separated by a space wherein said plurality of features have inclined sidewalls, wherein said plurality of features is above a surface of the substrate in said space; and
   a Group III-Nitride film formed on said patterned substrate wherein said Group III-Nitride film has a first crystal orientation in said space between said plurality of features and wherein said Group III-Nitride film has a second crystal orientation on said inclined sidewalls of said features wherein the second crystal orientation is different than the first crystal orientation, and wherein said first crystal orientation formed in said space is formed on and over said second crystal orientation formed on said inclined sidewalls of said features.

2. The semiconductor device of claim 1 wherein a plurality of voids are formed between said first crystal orientation and said second crystal orientation.

3. The semiconductor device of claim 1 wherein said Group III-Nitride film having said second crystal orientation has a thickness between 0.1-1.0 microns.

4. The semiconductor device of claim 1 wherein said inclined sidewalls of said features are inclined at an angle between 30°-60° from said substrate.

5. The semiconductor device of claim 1 wherein said patterned substrate is a patterned sapphire substrate.

6. The semiconductor device of claim 5 wherein the sapphire substrate is a sapphire substrate with an off-cut angle from the c-plane greater than 0.35°.

7. The semiconductor device of claim 1 further comprising a buffer layer formed between said patterned substrate and said Group III-Nitride.

8. The semiconductor device of claim 7 wherein said substrate is a sapphire substrate wherein said buffer layer comprises aluminum nitride, and wherein said Group III-Nitride is gallium nitride.

9. A semiconductor device comprising:
   a patterned substrate having a plurality of spaced apart features separated by a space wherein said plurality of features have inclined sidewalls; and
   a Group III-Nitride film formed on said patterned substrate wherein said Group III-Nitride film has a first crystal orientation in said space between said plurality of features and wherein said Group III-Nitride film has a second crystal orientation on said inclined sidewalls of said features, wherein said Group III-Nitride film having said second crystal orientation on said inclined sidewalls is a micro/nanocrystalline film and wherein said first crystal orientation is formed on said second crystal orientation.

10. The semiconductor device of claim 9 wherein a plurality of voids are formed between said first crystal orientation and said second crystal orientation.

11. The semiconductor device of claim 9 wherein said Group III-Nitride film having said second crystal orientation has a thickness between 0.1-1.0 microns.

12. The semiconductor device of claim 9 wherein said inclined sidewalls of said features are inclined at an angle between 30°-60° from said substrate.

13. The semiconductor device of claim 9 wherein said patterned substrate is a patterned sapphire substrate.

14. The semiconductor device of claim 13 wherein the sapphire substrate is a sapphire substrate with an off-cut angle from the c-plane greater than 0.35°.

15. The semiconductor device of claim 9 further comprising a buffer layer formed between said patterned substrate and said Group III-Nitride.

16. The semiconductor device of claim 15 wherein said substrate is a sapphire substrate wherein said buffer layer comprises aluminum nitride, and wherein said Group III-Nitride is gallium nitride.

* * * * *